United States Patent
Hsu et al.

(10) Patent No.: US 9,653,708 B2
(45) Date of Patent: May 16, 2017

(54) EMISSIVE DISPLAY

(71) Applicant: Innolux Corporation, Miao-Li County (TW)

(72) Inventors: Hsu-Kuan Hsu, Miao-Li County (TW); Chien-Hung Chen, Miao-Li County (TW); Hong-Yuan Chen, Miao-Li County (TW); Mei-Chi Hsu, Miao-Li County (TW); Pi-Ying Chuang, Miao-Li County (TW); Chu-Hong Lai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 185 days.

(21) Appl. No.: 14/489,523

(22) Filed: Sep. 18, 2014

(65) Prior Publication Data

US 2015/0085224 A1    Mar. 26, 2015

(30) Foreign Application Priority Data

Sep. 25, 2013 (TW) .............................. 102134598 A
Mar. 3, 2014 (TW) .............................. 103106947 A
Jun. 4, 2014 (TW) .............................. 103119349 A

(51) Int. Cl.
*G02F 1/133* (2006.01)
*H01L 51/52* (2006.01)
(Continued)

(52) U.S. Cl.
CPC ...... *H01L 51/5293* (2013.01); *H01L 27/3232* (2013.01); *H01L 51/5012* (2013.01); *Y10S 977/742* (2013.01)

(58) Field of Classification Search
CPC ............................... G02F 1/133; G02F 1/1365
See application file for complete search history.

(56) References Cited

U.S. PATENT DOCUMENTS 8,421,083 B2 * 4/2013 Yamazaki ........... H01L 27/1225
257/71
9,379,350 B2 * 6/2016 Koo .................... H01L 51/5203
(Continued)

FOREIGN PATENT DOCUMENTS

CN            1756827 A      4/2006

OTHER PUBLICATIONS

Mochizuki, et al.: "Emission behavior of molecularly doped electroluminescent device using liquidcrystalline matrix"; Applied Physics Letters 77, 1587 (2000); doi: 10.1063/1.1309026; pp. 1-4.
(Continued)

*Primary Examiner* — Timothy L Rude
(74) *Attorney, Agent, or Firm* — McClure, Qualey & Rodack, LLP

(57) ABSTRACT

A display comprises a first substrate, a second substrate opposite to the first substrate, an electrode structure, and a light-emitting combination (LEC) layer positioned between the first and second substrates, wherein the LEC layer comprises a light emitting material and a LC material, and a horizontal or vertical electric field is generated when a voltage is applied to that electrode structure. One of exemplified displays has an electrode structure comprising a first electrode and a second electrode oppositely disposed, and the LEC layer is positioned between the first and second electrodes, wherein a vertical electric field is generated when a voltage is applied. The device can further comprise an electron injection layer and a hole transport layer. Another exemplified display has an electrode structure arranged on one side of the first substrate, and a horizontal electric field is generated when a voltage is applied.

10 Claims, 15 Drawing Sheets

(51) Int. Cl.
    *H01L 51/50*      (2006.01)
    *H01L 27/32*      (2006.01)

(56)                    References Cited

U.S. PATENT DOCUMENTS

2006/0278849  A1     12/2006   Suzuki et al.
2010/0134735  A1*     6/2010   Nakamura .......... H01L 31/1055
                                                          349/116
2014/0327862  A1*    11/2014   Hatsusaka ......... C09K 19/0225
                                                          349/100

OTHER PUBLICATIONS

Honma, et al.: "Oblique Extraction of Polarized Light from Light-Emitting Liquid Crystal Cells Doped with a Fluorescent Dye"; Japanese Journal of Applied Physics 52 (2013) 070205; pp. 1-4.
SIPO Office Action dated Dec. 1, 2016 in Chinese application (No. 201410244675.0).

* cited by examiner

EMISSIVE DISPLAY

This application claims the benefits of Taiwan application Ser. No. 102134598, field Sep. 25, 2013, and Taiwan application Ser. No. 103106947, field Mar. 3, 2014, and Taiwan application Ser. No. 103119349, field Jun. 4, 2014, the subject matters of which are incorporated herein by references.

BACKGROUND

Field of the Invention

The disclosure relates in general to a display, and more particularly to an emissive display which emits light in response to an electric current.

Description of the Related Art

Compared to older cathode ray tube (CRT) monitors, the displays such as thin film transistor liquid crystal displays (TFT-LCD), plasma display panels (PDP) and organic electroluminescent display (OLED) are more compact in size and lighter in weight, and thus have become the popular displays in today's use. Conventional TFT-LCD is a display not emitting light in response to an electric current, and requires a backlight module as a light source for image display and optical films for distributing the light uniformly. Compared to the TFT-LCD, OLED possesses advantages of light emission in response to an electric current, light weight, slim appearance, flexibility, full color, high brightness, low power consumption, wide viewing angle, quick response and simple fabrication. However, conventional OLED suffers from the low luminous efficiency.

SUMMARY

The disclosure is directed to a display having a light-emitting combination layer which comprises a light emitting material and a liquid crystal material, thereby forming an emissive display with improved luminous efficiency and uniformed light distribution.

According to one embodiment of the disclosure, a display is provided, comprising a first substrate, a second substrate opposite to the first substrate, an electrode structure disposed on at least one of the first substrate and the second substrate, and a light-emitting combination (LEC) layer positioned between the first and second substrates. The LEC layer comprises a light emitting material and a LC material, and a horizontal or vertical electric field can be generated when a voltage is applied to that electrode structure.

According to another embodiment of the disclosure, a display can further comprises a first electrode and a second electrode opposite to the first electrode, wherein the light-emitting combination layer is positioned between the first electrode and the second electrode, and a vertical electric field is generated when a voltage is applied to the first electrode and the second electrode. According to one embodiment, a display can further comprises an electron injection layer formed on the first electrode and a hole injection layer formed on the second electrode, wherein the light-emitting combination layer is positioned between the electron injection layer and the hole injection layer.

According to still another embodiment of the disclosure, a display is provided, comprising a first substrate, a second substrate opposite to the first substrate, an electrode structure disposed on one side of the first substrate, and a light-emitting combination (LEC) layer positioned between the first and second substrates. A horizontal electric field is generated when a voltage is applied to the electrode structure.

The above and other aspects of the disclosure will become better understood with regard to the following detailed description of the preferred but non-limiting embodiments. The following description is made with reference to the accompanying drawings.

DETAILED DESCRIPTION

Figure 1:
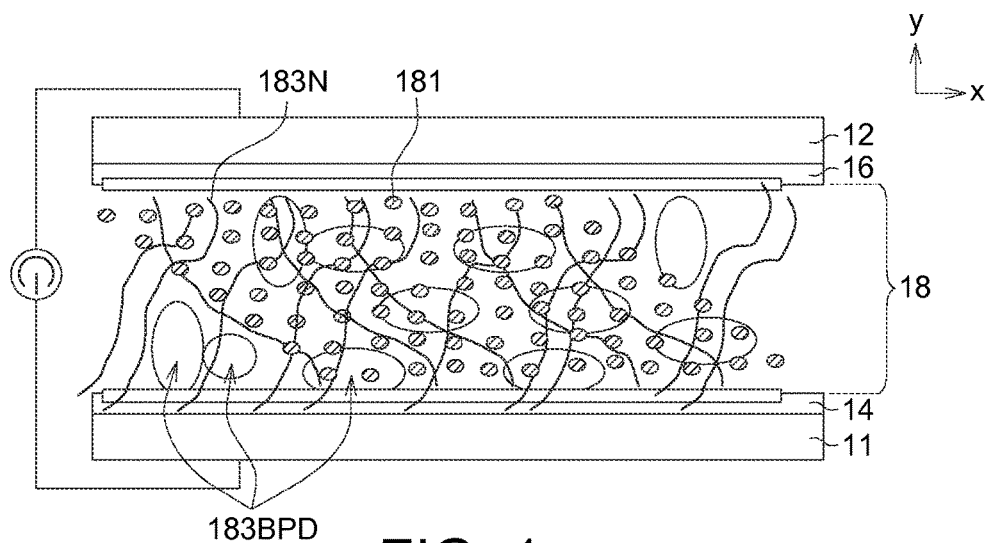
FIG. 1 is a cross-sectional view of a display panel.

A display of the embodiment is disclosed by providing a light-emitting combination layer with the light emitting material and the liquid crystal material, thereby forming an emissive display. In the display of the embodiment, no traditional backlight unit is required for being a light source. According to the design of the embodiment, the luminous efficiency of the embodied display can be significantly improved, and a uniform light distribution can be acquired. Also, an electrode structure for generating a vertical electrical field or a horizontal electrical field can be adopted in the display of the embodiment, and the present disclosure has no particular limitation thereto.

In one embodiment, a display comprises a first substrate, a second substrate opposite to the first substrate, an electrode structure and a light-emitting combination (LEC) layer. The electrode structure is disposed on at least one of the first substrate and the second substrate, or both. A horizontal electric field or a vertical electric field can be generated when a voltage is applied to the electrode structure. The light-emitting combination layer is positioned between the first and second substrates, and comprises a light emitting material and a liquid crystal material. When an operation voltage sufficient to initiate the electroluminescence from the light emitting material is applied to the display, the light-emitting combination layer emits light for being a light source of the embodied display. Thus, it is no need to incorporate the traditional backlight unit as the light source for the embodied display.

In the embodiments, the applicable liquid crystal material could comprises non-self-assembled liquid crystals such as general LCs, or self-assembled liquid crystals such as liquid crystals in a periodic structure (like a photonic crystal). The liquid crystals in a periodic structure could be a non-dimensional periodic structure, such as cholesteric liquid crystals in the non-dimensional periodic structure. Also, the liquid crystals in a periodic structure could be a dimensional periodic structure, such as polymer-stabilized blue phase liquid crystals, polymer-stabilized ferroelectric liquid crystals, or ferroelectric liquid crystals without polymer network. Applicable liquid crystal materials for the displays of the embodiments are not particular limited, and they can be optionally selected and determined based on the design conditions of practical applications.

The embodiments are described in details with reference to the accompanying drawings. It is noted that the details of the structures of the embodiments are provided for exemplification, and the described details of the embodiments are not intended to limit the present disclosure. The identical and/or similar elements of the embodiments are designated with the same and/or similar reference numerals. Also, the displays of the first to seventh embodiments have the electrode structures capable of generating the vertical electrical field, while the displays of the eighth to tenth embodiments have the electrode structures capable of generating the horizontal electrical field. It is noted that not all embodiments of the invention are shown. Modifications and variations can be made without departing from the spirit of the disclosure to meet the requirements of the practical applications. Thus, there may be other embodiments of the present disclosure which are not specifically illustrated. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense.

<Display with Vertical Electric Field>
<First Embodiment>

FIG. 1 is a cross-sectional view of a display according to the first embodiment of the disclosure. Although the structure of FIG. 1 is depicted for exemplifying an embodiment, the details of this display are not provided for limiting the scope of protection of the disclosure. In the first embodiment, the display 10 comprises a first electrode 11, a second electrode 12, an electron injection layer 14 formed on the first electrode 11, a hole transport layer 16 formed on the second electrode 12, and a light-emitting combination layer 18 positioned between the electron injection layer 14 and the hole transport layer 16. The first electrode 11 and the second electrode 12 could be formed on a first substrate (not depicted in the drawings) and a second substrate (not depicted in the drawings), respectively. In an embodiment, the light-emitting combination layer 18 at least comprises a light emitting material 181 and a liquid crystal material, wherein the light-emitting combination layer 18 is a light-emitting layer of the display 10.

When a voltage or electric current is applied for driving the display (the first electrode 11 coupled to the second electrode 12), electrons and holes are injected into the light emitting material 181 of the light-emitting combination layer 18. When electrons and holes are recombined, light is emitted from the light emitting material 181, wherein the emitted light is referred to as electroluminescence. In one embodiment, the light emitting material 181 is an organic light emitting material.

In the first embodiment, a three-dimensional periodic structure —polymer-stabilized blue phase (PSBP) liquid crystals (i.e. a self-assembled structure with three dimensional photonic crystals) is selected as the liquid crystal material of the light-emitting combination layer 18. As shown in FIG. 1, the three-dimensional periodic structure of PSBP liquid crystals includes blue-phase liquid crystals and a polymer network 183N which stabilizes the blue phase liquid crystals. Several BP LC domains 183BPD are formed in the light-emitting combination layer 18.

Blue phase liquid crystals exhibits several attractive features, such as no alignment layer required and submillisecond response time. In the cubic lattice of blue phases, the basic unit is the double twist cylinder (DTC) structure in which the director is parallel to the axis at the centre. Thus, the blue phase liquid crystals have the feature of fluid lattice. In the absence of electric fields, there can be three blue phases: BPI and BPII, both of which have cubic symmetry; and BPIII, which possesses the same symmetry as the isotropic (amorphous) phase, also known as fog phase. BPI has the body-centered cubic (BCC) symmetry, and BPII has the simple cubic (SC) symmetry. BPI, BPII and BP III have the feature of high charility, which lead to the DTC structure of the blue phase liquid crystals, and the excellent periodicity in the LC space.

Blue phase liquid crystals (BPLC) appear over a very narrow temperature range (such as 0.5~2° C.) at the helical-isotropic boundary (three blue phases, BPI, BPII and BPIII are defined by the appearing temperatures from low to high), and their applications are limited by the narrow temperature range. Several methods have been proposed to widen the temperature range of BPLC. The one that attracts the most interest is the polymer stabilization method by using the cross-linked polymer network to stabilizing the lattice structure of blue phases. As a result, the temperature range of BPLC has been extended from 1K to more than 60K, including room temperature (260-326K), and the lattice structure of blue phases is well-stabilized.

Although the conventional display with BPLC shows extremely short response time, it suffers from higher driving voltage and hysteresis effect. However, BPLC of the display of the embodiment is not adopted for being the displaying medium, but for the improvement of the lighting efficiency and the light distribution uniformity of the display due to the characteristics of the BPLC periodic structure. In the device of the embodiment, the light-emitting material 181 (such as the electroluminescent organic material) is activated to emit light by applying a driving voltage or an electric current. Accordingly, the periodicity of BPLC won't be changed during the electroluminescence of the device at an operation voltage (i.e. the operation voltage is not sufficient to change the periodic structure of BPLC), and the BPLC domains 183BPD as shown in FIG. 1 still exists stably. The BPLC exhibits a stable periodic structure. Accordingly, the luminous efficiency of the embodied display can be significantly improved and a uniform light distribution can still be acquired even the embodied display is operated repeatedly.

According to one embodiment, the light emitting material 181 can be mixed with the UV-curable monomers and the BP liquid crystals to form a mixture during the fabrication. Then, the mixture is heated at an appropriate heating rate (such as 0.01~5° C./min, or other heating rate) until the BP liquid crystals of the mixture becomes optically isotropic. Then, the mixture is exposed (such as for 1~15 minutes) by an exposure machine with a UV-light (whose power is between 1~20 milliwatts (mW)), so that the monomers are cross-linked to form a polymer network 183N to stabilize the BP liquid crystals. It is noted that the aforementioned steps are not the only manufacturing method for all of the embodiments. The disclosure has no particular limitation to the applicable manufacturing method. Details of related steps for making the light-emitting combination layer 18 can be modified and changed according to the actual needs of the practical applications.

Additionally, the display of the embodiment may optionally further include an electron injection material, or a hole injection material, or both thereof in the light-emitting combination layer 18, for improving the lighting performance of the device.

Figure 2:
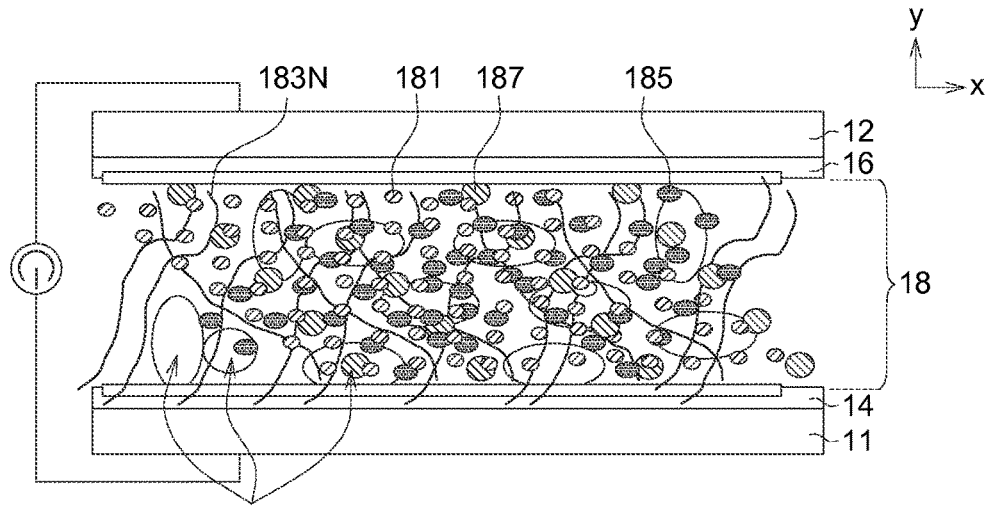
FIG. 2 is a cross-sectional view of another display according to the first embodiment of the disclosure.

FIG. 2 is a cross-sectional view of another display according to the first embodiment of the disclosure. In FIG. 2, the display 10' similarly comprises the first electrode 11, the second electrode 12, the electron injection layer 14, the hole transport layer 16, and a light-emitting combination layer 18. Besides the light emitting material 181 and the liquid crystal material (such as the polymer network 183N for stabilizing the BP liquid crystals, thereby forming the BP LC domains 183BPD), an electron injection material 185 and a hole injection material 187 are further added to generate more holes and electrons in the light-emitting combination layer 18, so that the band-gap energy of the light emission can be reduced. In one embodiment, the electron injection material 185 and the hole injection material 187 can be presented by regular or irregular particles or other shapes, and both materials and the light emitting material 181 can be evenly or randomly distributed in the light-emitting combination layer 18.

<Second Embodiment>

Figure 3:
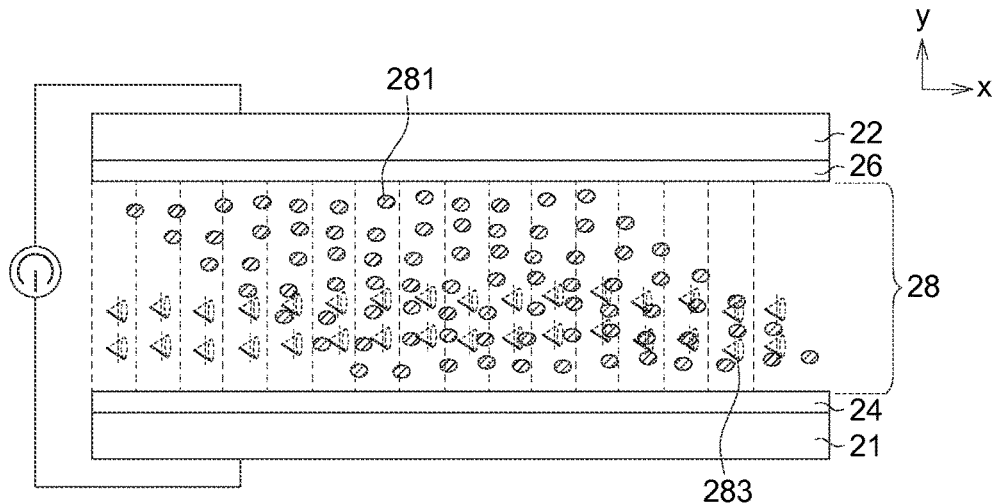
FIG. 3 is a cross-sectional view of a display according to the second embodiment of the disclosure.

FIG. 3 is a cross-sectional view of a display according to the second embodiment of the disclosure. In the second embodiment, the display 20 comprises a first electrode 21, a second electrode 22, an electron injection layer 24 formed on the first electrode 21, a hole transport layer 26 formed on the second electrode 22, and a light-emitting combination layer 28 positioned between the electron injection layer 24 and the hole transport layer 26. Similarly, the light-emitting combination layer 28 at least comprises a light emitting material 281 and a liquid crystal material, wherein the light-emitting combination layer 28 is a light-emitting layer of the display 20.

When a voltage or electric current is applied for driving the display (the first electrode 21 coupled to the second electrode 22), electrons and holes are injected into the light-emitting combination layer 28. When electrons and holes are recombined, light is emitted from the light emitting material 281, wherein the emitted light is referred to as electroluminescence. In one embodiment, the light emitting material 281 is an organic light emitting material.

In the second embodiment, one-dimensional periodic structure —polymer-stabilized ferroelectric liquid crystals (FLC) 283 is selected as the liquid crystal material of the light-emitting combination layer 28.

Only a minority of ferroelectric materials exhibits the fluid state, and ferroelectric liquid crystals (FLC) is one of them. The molecular dipole moment of FLC is perpendicular to the director along the long axis of molecule which corresponds to the direction normal to the smectic layers. On average, molecules are tilted from the smectic layer normal by an angle θ. The phase is optically biaxial. The origin of the spontaneous polarization from the molecular structure is also aligned along a particular direction. In the helicoidal structure of chiral smectic C (SmC*, star standing for chirality) liquid crystal, each layer is similar to that of the usual SmC phase, but because of chirality there is a non-zero in-layer spontaneous dipole moment which is perpendicular to the average molecular direction and to the tilt direction. Under arrangement of the smectic layers in the tilt smectic phase, the FLC molecules have a permanent electric dipole perpendicular to the long axis of the molecule (the director). The microcosm of electric dipoles are oriented towards the same direction (i.e. spontaneous polarization) forms a direction of spontaneous polarization (Ps), and it leads to the feature of ferroelectricity. An interesting electro-optic effect of FLC molecules is optical bistability. There exist two stable optical states, so that the FLC molecules can be switched from one state to another state quickly by changing the directions of the applied electrical field. As shown in FIG. 3, the surface of the virtual cone on which the FLC 283 molecules are aligned is so called as the equal energy surface. When an electrical field is applied, the dipole moments of the FLC 283 molecules are reversed and rotate alone the surface of the virtual cone according to the direction of the electrical field.

In the embodiment, the alignment layers of the ferroelectric liquid crystals 283 with permanent dipole moments are arranged along the X-direction to reach a lower energy level, as shown in FIG. 3.

Additionally, ferroelectric liquid crystals without a polymer network, or polymer-stabilized ferroelectric liquid crystals (PSFLC) are applicable in the second embodiment, and the disclosure has no limitation thereto. An example of PSFLC includes ferroelectric liquid crystals and a polymer network which stabilizes the ferroelectric liquid crystals.

In this embodiment, the alignment layers of the ferroelectric liquid crystals 283 in the light-emitting combination layer 28 exhibits a stable arrangement of one-dimensional periodicity, and the periodicity won't be changed during the lighting of the device at the operation voltage. Accordingly, the luminous efficiency of the embodied display can be significantly improved and a uniform light distribution can still be acquired after the embodied display is operated repeatedly for a long time.

Similarly, the display of the second embodiment may optionally further include an electron injection material, or a hole injection material, or both, for improving the lighting performance of the device.

Figure 4:
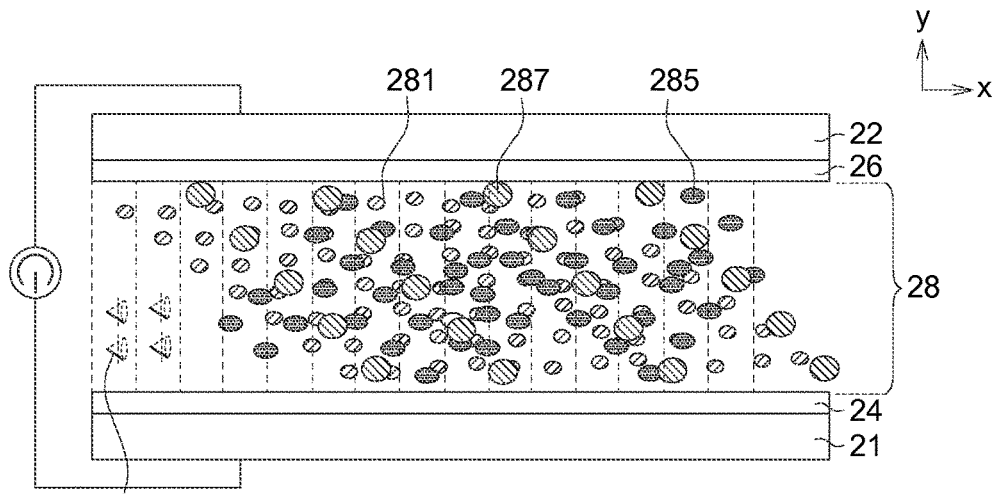
FIG. 4 is a cross-sectional view of another display according to the second embodiment of the disclosure.

FIG. 4 is a cross-sectional view of another display according to the second embodiment of the disclosure. In FIG. 4, the display 20' similarly comprises the first electrode 21, the second electrode 22, the electron injection layer 24, the hole transport layer 26, and a light-emitting combination layer 28. Besides the light emitting material 281 and the ferroelectric liquid crystals 283, an electron injection material 285 and a hole injection material 287 are further added to generate more holes and electrons in the light-emitting combination layer 28, so that the band-gap energy of the light emission can be reduced. In one embodiment, the electron injection material 285 and the hole injection material 287 can be presented by regular or irregular particles or other shapes, and both materials and the light emitting material 281 can be evenly or randomly distributed in the light-emitting combination layer 28.

<Third Embodiment>

Device structure of the third embodiment is similar to that of the first and second embodiments. Please refer to FIG. 1~FIG. 4 of the first and second embodiments, and the details of configurations are not redundantly described herein. In the third embodiment, cholesteric liquid crystal (CLC) is selected as the liquid crystal material of the light-emitting combination layer.

Cholesteric liquid crystals (CLC) have a property of the self-assembled one-dimensional structure of photonic crystals. Cholesteric liquid crystals placed between two parallel surface treated plates form a planar homogeneous texture in the absence of an external electric field. The axis of the helix formed by the director lies normal to the plates, with the director of the molecules adjacent to the plates parallel to the rubbing direction. If a small electric field is applied normal to the plates in the example above, the molecules tends to align the director normal to the plates, and a focal conic texture is formed due to interactions with adjacent molecules and with anchoring effects near the plates. A random distribution of helical axes is characteristic of the focal conic texture. The periodicity of helical axes of CLC improves the luminous efficiency and light distribution of the embodied display. In the typical LCD application with CLC, if an electric field above a threshold value (ex: over dozens of voltages) is applied, the helical structure of the focal conic texture is untwisted and the director becomes perpendicular to the plates, forming the homeotropic texture. However, the light of the device of the embodiment is emitted from the light-emitting material 181 by applying an operation voltage or an electric current, wherein this operation voltage is not sufficient to achieve the untwisted state of CLC. Thus, the periodicity of CLC won't be changed during the electroluminescence of the device at an operation voltage (i.e. the operation voltage is not sufficient to change the periodic structure of CLC). The CLC exhibits a stable periodic structure. Accordingly, the luminous efficiency of the embodied display with CLC can be significantly improved and a uniform light distribution can still be acquired even the embodied display is operated repeatedly for a long time.

<Fourth Embodiment>

Although the devices as exemplified above include the electron injection layer and the hole transport layer, the applicable devices of the embodiments are not limited thereto.

Figure 5:
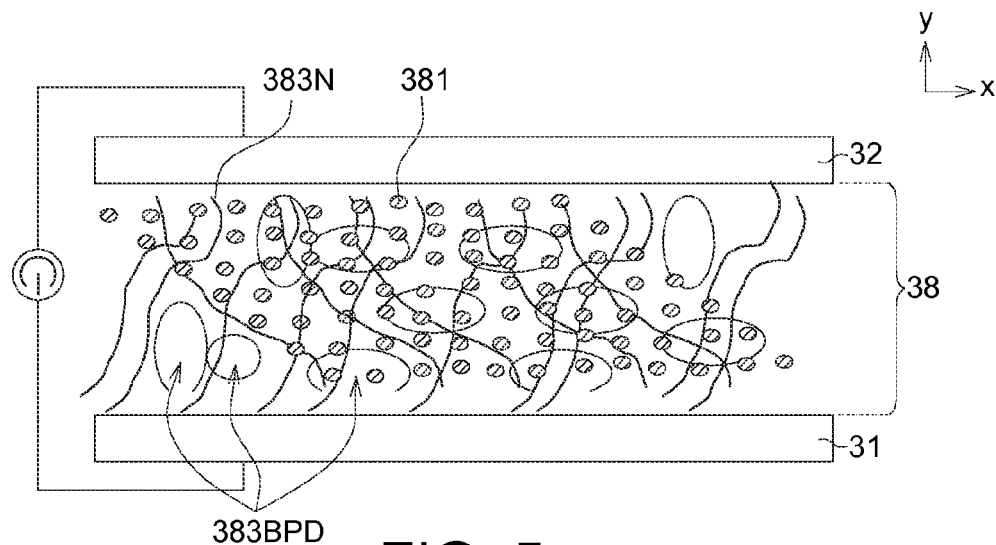
FIG. 5 is a cross-sectional view of a display according to the fourth embodiment of the disclosure.
Figure 6:
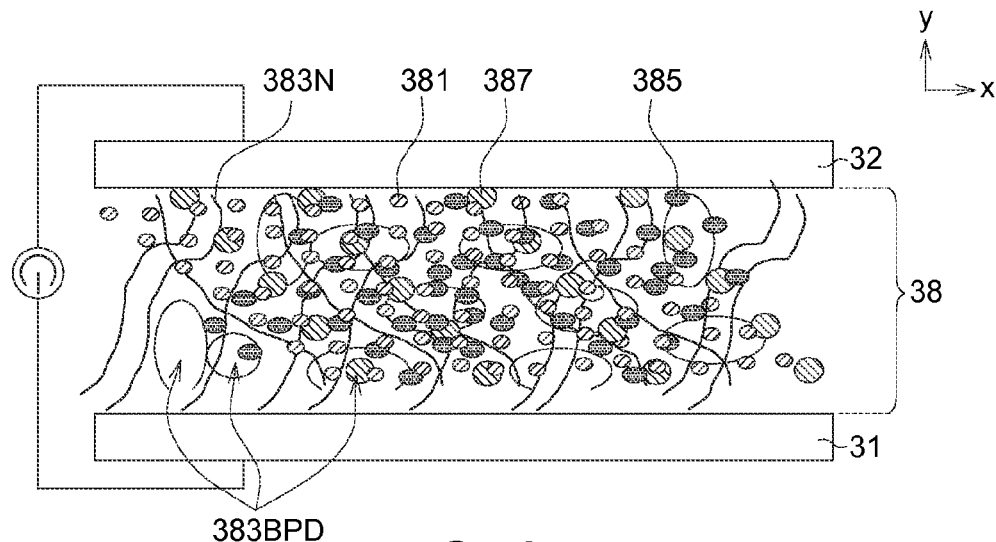
FIG. 6 is a cross-sectional view of another display according to the fourth embodiment of the disclosure.

FIG. 5 is a cross-sectional view of a display according to the fourth embodiment of the disclosure. In the fourth embodiment, the display 30 comprises a first electrode 31, a second electrode 32 opposite to the first electrode 31, and a light-emitting combination layer 38 positioned between the first electrode 31 and the second electrode 32. Similarly, the light-emitting combination layer 38 at least comprises a light emitting material 381 and a liquid crystal material, wherein the light-emitting combination layer 38 is the light-emitting layer of the display 30. In the fourth embodiment, a three-dimensional periodic structure—polymer-stabilized blue phase (PSBP) liquid crystals (as illustrated in FIG. 5 and FIG. 6) is selected as the liquid crystal material of the light-emitting combination layer 38. However, the embodiments are not limited thereto. Liquid crystals with the self-assembled structure or non-self-assembled structure can be adopted as the liquid crystal material of the light-emitting combination layer 38.

Similarly, the light-emitting combination layer of the display of the fourth embodiment may optionally further comprise an electron injection material, or a hole injection material, or both, for improving the lighting performance of the device. The following description of the light-emitting combination layer containing both of the electron injection material and the hole injection material is made with reference to the accompanying drawings.

FIG. 6 is a cross-sectional view of another display according to the fourth embodiment of the disclosure. In FIG. 6, the display 30' similarly comprises the first electrode 31, the second electrode 32, and a light-emitting combination layer 38. Besides the light emitting material 381 and the liquid crystal material, the electron injection material 385 and the hole injection material 387 are further added to generate more holes and electrons in the light-emitting combination layer 38, so that the band-gap energy of the light emission can be reduced. In one embodiment, the electron injection material 385 and the hole injection material 387 can be presented by regular or irregular particles or other shapes, and both materials and the light emitting material 381 can be evenly or randomly distributed in the light-emitting combination layer 38.

Although the aforementioned displays of the embodiments adopt the self-assembled structures of liquid crystals for exemplification (FIG. 1-FIG. 6), the present disclosure is not limited thereto. In practical applications, the light-emitting combination layer comprising liquid crystals with self-assembled structure or non-self-assembled structure as the liquid crystal material mixed with the light emitting material can be applied, which is able to constitute the light-emitting combination layer of an emissive device of the embodiment. Thus, the present disclosure has no particular limitation to the types of the applicable liquid crystal materials, and it can be selected according to the actual design conditions of the applications. In the following embodiments, the light-emitting combination layers comprising liquid crystals with non-self-assembled structures are exemplified for the illustration of other embodiments.

Moreover, the disclosure can be applied to various types of displays in the practical applications, such as the MVA (multi-domain vertical alignment) display having pixel electrodes with silts, or the display having electrodes with protrusions. By disposing the alignment films or distributing conductors in the alignment films, the emission uniformity of the display can be significantly improved, and the lighting efficiencies of the display can be increased consequently.

<Fifth Embodiment>

In the fifth embodiment, the display further comprises the alignment films, with or without the conductors distributed therein, for improving the emission uniformity and the lighting efficiencies of the display.

Figure 7A:
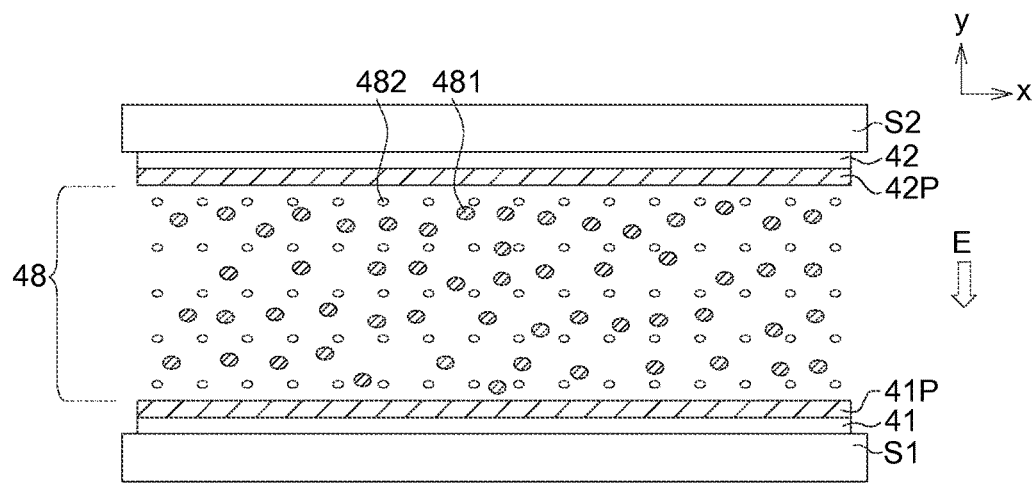
FIG. 7A is a cross-sectional view of a display according to the fifth embodiment of the disclosure.

FIG. 7A is a cross-sectional view of a display according to the fifth embodiment of the disclosure. As shown in FIG. 7A, the display 40 comprises a first electrode 41 formed on a first substrate S1, a second electrode 42 formed on a second substrate S2, a first alignment film 41P formed on the first electrode 41, a second alignment film 42P formed on the second electrode 42, and a light-emitting combination layer 48 positioned between the first alignment film 41P and the second alignment film 42P. In this embodiment, the first electrode 41 and the second electrode 42 are full conductive plates, such as full ITO layers.

In the embodiment, the light-emitting combination layer 48 at least comprises a light emitting material 481 and a liquid crystal material 482. The liquid crystal material 482 can be the self-assembled or non-self-assembled liquid crystals. The non-self-assembled liquid crystals (i.e. general liquid crystals) are exemplified in the fifth embodiment. In one embodiment, the light emitting material 481 is an organic light emitting material. The light-emitting combination layer 48 is the light-emitting layer of the display 40. When a voltage or electric current is applied for driving the display 40 (the first electrode 41 coupled to the second electrode 42), electrons and holes are injected into the light-emitting combination layer 48. When electrons and holes are recombined, the light is emitted from the light emitting material 481, wherein the emitted light is referred to as electroluminescence.

Figure 7B:
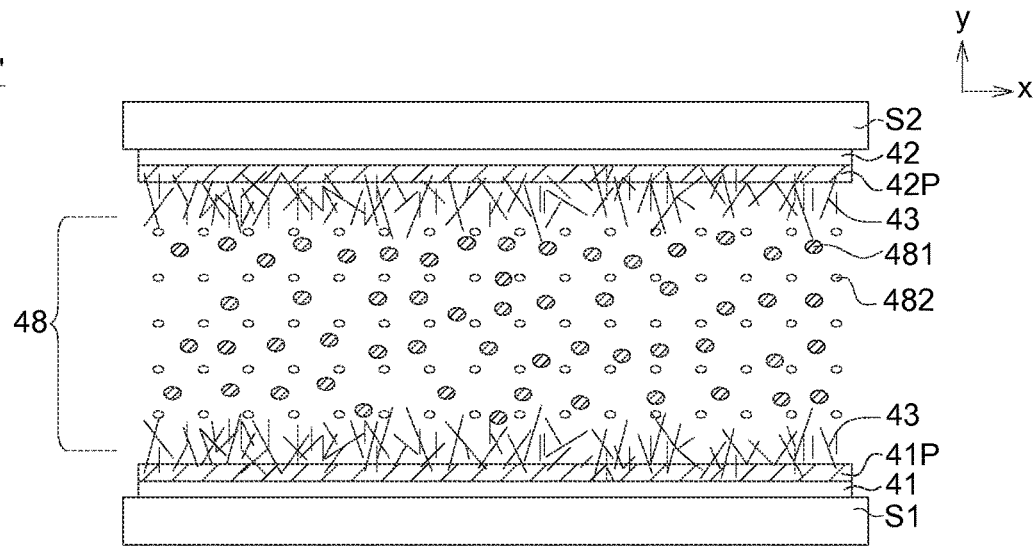
FIG. 7B is a cross-sectional view of another display according to the fifth embodiment of the disclosure.

FIG. 7B is a cross-sectional view of another display according to the fifth embodiment of the disclosure. Elements of FIG. 7B are identical to that of FIG. 7A, except for the conductors 43 distributed in the alignment films of FIG. 7B. In one embodiment, a plurality of conductors 43 are distributed at one of the first alignment film 41P and the second alignment film 42P, or both (FIG. 7B). The conductors 43 can be the carbon nano-tubes, or other conductive material capable of mixing with the material of alignment film and completing the distribution in the application. In one embodiment, long axes of the conductors 43 are oriented towards the first electrode 41 or the second electrode 42, as shown in FIG. 7B.

In one of the fabrication by using the carbon nano-tubes as the conductors 43, the carbon nano-tubes are mixed with the material of the alignment film to form a mixture. Then, the mixture is coated on the electrode. A magnetic force is applied during the coating of the mixture for orienting the conductive carbon nano-tubes vertically, so as to accomplish the distribution of carbon nano-tubes shown in FIG. 7B. Emission uniformity and lighting efficiencies of the display can be improved by disposing the alignment film with the conductors.

<Sixth Embodiment>

In the fifth embodiment, full conductive plates are exemplified as the electrodes of the embodied display. In the sixth embodiment, the pixel electrode having slits is exemplified for illustrating a MVA (multi-domain vertical alignment) display. Also, the MVA display further comprises the alignment films distributed with the conductors for improving the emission uniformity and the lighting efficiencies of the display.

Figure 8A:
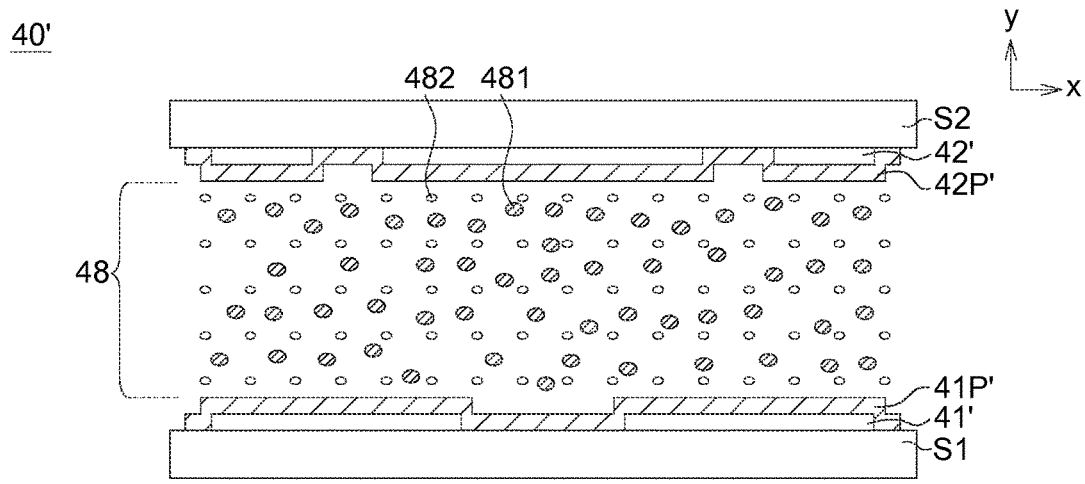
FIG. 8A is a cross-sectional view of a display according to the sixth embodiment of the disclosure.
Figure 8B:
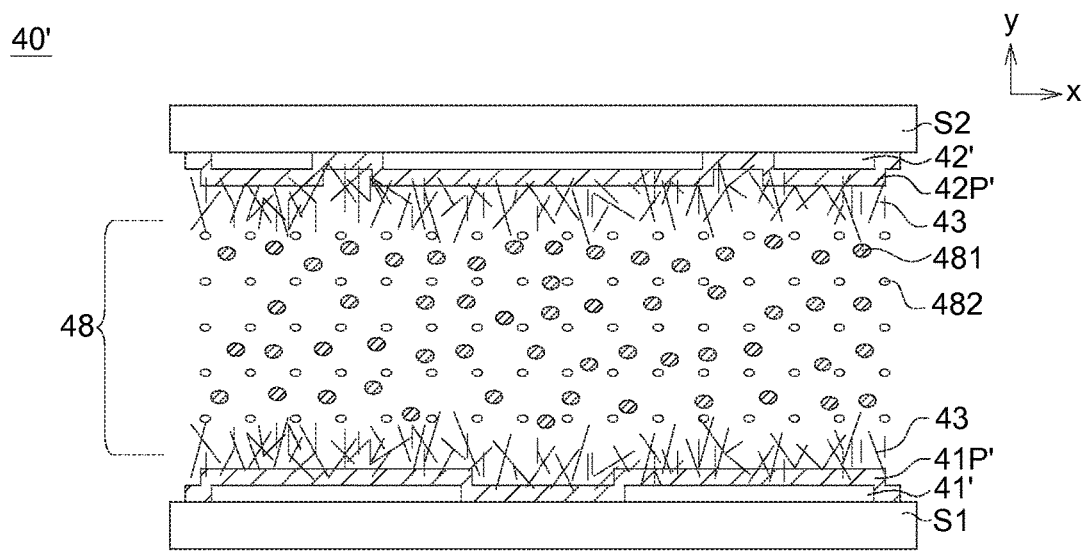
FIG. 8B is a cross-sectional view of another display according to the sixth embodiment of the disclosure.

FIG. 8A is a cross-sectional view of a display according to the sixth embodiment of the disclosure. FIG. 8B is a cross-sectional view of another display according to the sixth embodiment of the disclosure. As shown in FIG. 8A and FIG. 8B, the display 40' comprises a first electrode 41' formed on a first substrate S1, a second electrode 42' formed on a second substrate S2, a first alignment film 41P' formed on the first electrode 41', a second alignment film 42P' formed on the second electrode 42', and a light-emitting combination layer 48 positioned between the first alignment film 41P' and the second alignment film 42P'. In this embodiment, the first electrode 41' and the second electrode 42' are electrodes with slits. The emission uniformity and the lighting efficiencies of the display can be improved by disposing the alignment films.

Also, the conductors 43, such as carbon nano-tubes, are further distributed in the alignment films of the device of FIG. 8B. In the embodiment, the long axes of the conductors 43 are oriented vertically. For example, the long axes of the conductors 43 are oriented substantially towards the first electrode 41' or the second electrode 42'. It is observed that the defect of non-uniform light intensity caused by the point discharge at the electrode corners can be significantly improved due to the conductors 43 distributed in the alignment films.

When the light emitting material of the light-emitting combination layer 48 of the display 40' is driven to emit light, it is evidenced by several experimental results that emission uniformity and lighting efficiencies of the embodied display can be improved if the alignment films are deposited on the electrodes. It is also evidenced by several experimental results that the emission uniformity and lighting efficiencies of the display can be greatly improved by depositing the alignment films with the conductors (ex: carbon nano-tubes) on the electrodes.

<Seventh Embodiment>

In the seventh embodiment, an embodied display having full electrodes with the protrusions thereon is exemplified for illustration. Also, the display of the seventh embodiment further comprises the alignment films, with or without the conductors, for improving the emission uniformity and the lighting efficiencies of the display.

Figure 9A:
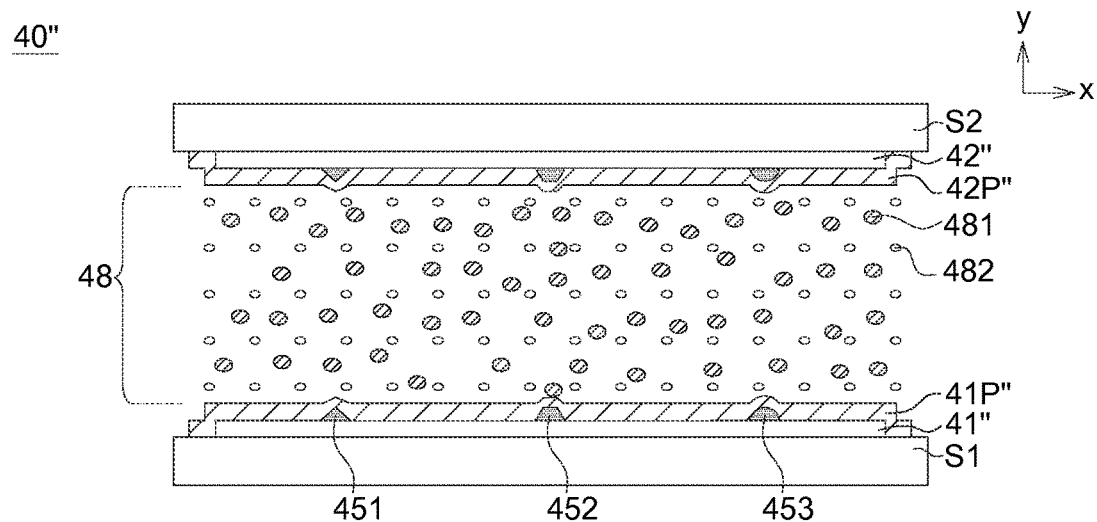
FIG. 9A is a cross-sectional view of a display according to the seventh embodiment of the disclosure.
Figure 9B:
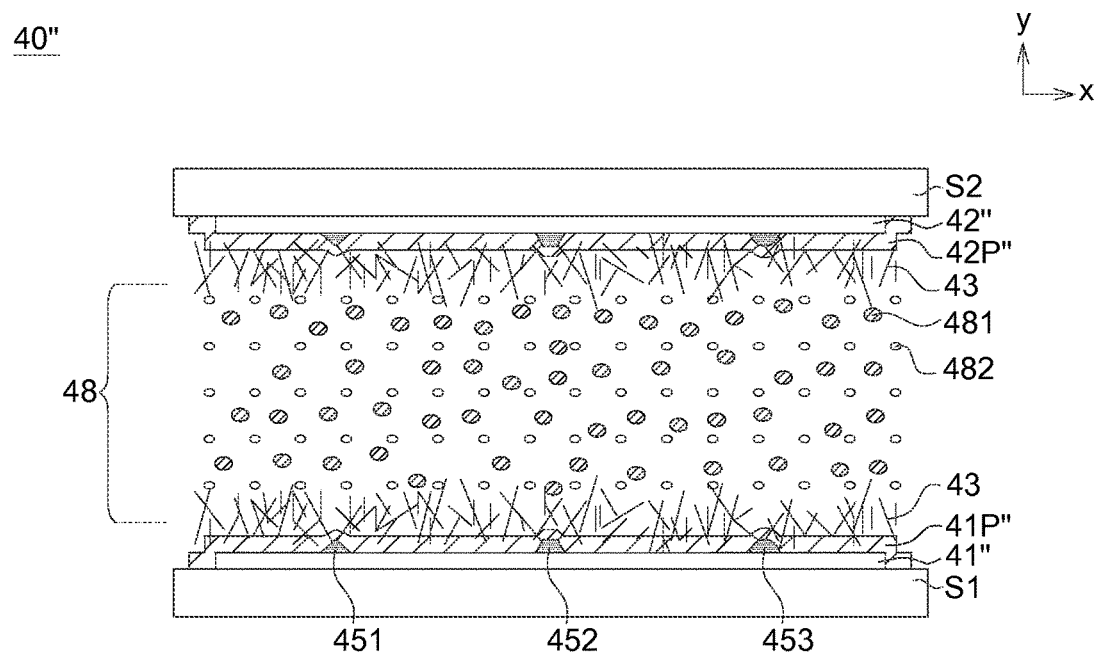
FIG. 9B is a cross-sectional view of another display according to the seventh embodiment of the disclosure.

FIG. 9A is a cross-sectional view of a display according to the seventh embodiment of the disclosure. FIG. 9B is a cross-sectional view of another display according to the seventh embodiment of the disclosure. Similar to the display of the fifth embodiment, as shown in FIG. 9A and FIG. 9B, the display 40" comprises a first electrode 41" formed on a first substrate S1, a second electrode 42" formed on a second substrate S2, a first alignment film 41P" formed on the first electrode 41", a second alignment film 42P" formed on the second electrode 42", and a light-emitting combination layer 48 positioned between the first alignment film 41P" and the second alignment film 42P". In this embodiment, the first electrode 41" and the second electrode 42" are full electrodes with the protrusions thereon. Examples of the protrusions include the protrusions 451 with triangle cross-sections, the protrusions 451 with the trapezoidal cross-sections, the protrusions 453 with the rounded (or elliptic) cross-sections, and the protrusions with other cross-sectional shapes. The present disclosure has not particular limitation thereof. The configuration and arrangement of the protrusions of the embodied device can be determined according to design requirements of the practical applications. The first alignment film 41P" and the second alignment film 42P" are respectively deposited on the first electrode 41" and the second electrode 42" to cover the protrusions. Moreover, the conductors 43, such as carbon nano-tubes, can be further distributed in the alignment films of the device, as shown in FIG. 9B. In the embodiment, the long axes of the conductors 43 are oriented vertically (ex: the long axes of the conductors 43 are oriented substantially towards the first electrode 41" or the second electrode 42").

The emission uniformity and the lighting efficiencies of the display can be improved by disposing the alignment films. The defect of non-uniform light intensity caused by the point discharge at the electrode corners can be significantly improved due to the conductors 43 distributed in the alignment films. When the light emitting material of the light-emitting combination layer 48 of the display 40" is driven to emit light, the emission uniformity and lighting efficiencies of the display of the seventh embodiment can be greatly improved.

Additionally, the light-emitting combination layers of the displays of the fifth to seventh embodiments can further comprise an electron injection material 285, or a hole injection material, or both of them. Alternatively, an electron injection layer and/or a hole injection layer can be optionally incorporated into the embodied displays for improving the lighting performance of the device.

<Display with Horizontal Electric Field>

Although the displays with vertical electric fields are exemplified in the aforementioned embodiments (i.e. the first to seventh embodiments), the applicable devices are not limited to those embodied types. The present disclosure can be applied to the displays with horizontal electric fields. Examples of applicable displays with horizontal electric fields include the FFS (fringe field switching) displays, the AFFS (advanced fringe field switching) displays, the IPS (in-plane switching) displays, the S-IPS (super-IPS) displays, the AS-IPS (advanced super-IPS) displays, the IPS-Pro displays, the AAS (azimuthal anchoring switching) displays, and the like. Different electrode structures can be constructed for the different types of displays to accomplish the specific image display of their own. For example, the electrode structures of the S-IPS and AS-IPS devices have chevron patterns for acquiring the images with good color contrast.

It is noted that not all embodiments of the invention are shown, and the electrode structures of the devices exemplified herein are only for illustration, not for limitation. The practical configuration of the electrode structures can be made with appropriate modifications and variations to meet the design requirements of the applications. Therefore, the present disclosure can be applied to other types of displays with horizontal electric fields (or vertical electric fields) not mentioned before.

Similarly, when the present disclosure is applied to the display with horizontal electric field, the liquid crystals with self-assembled structure or non-self-assembled structure are all applicable for being the liquid crystal material of the light-emitting combination layer. Thus, the present disclosure has no particular limitation to the types of the applicable liquid crystal materials, and it can be selected according to the actual design conditions of the applications. Moreover, since the light of the embodied device is the electroluminescence from the light emitting material by applying an operating voltage or electric current, the operating voltage is not sufficient (and also not necessary) to change the state of the LC molecules. Accordingly, the drawings related to the embodiments below depict the non-rotated state of the LC molecules.

The embodiments below illustrate the displays with horizontal electric fields, which comprise non-self-assembled structures of liquid crystals as the liquid crystal materials of the light-emitting combination layers. Also, the accompany drawings are simplified for clear illustrations of the embodiment, and sizes and proportions in the drawings are not directly proportional to actual products.

<Eighth Embodiment>

The electrode structures of the embodiments below are laterally formed on one side of the first substrate S1 for illustration.

Figure 10A:
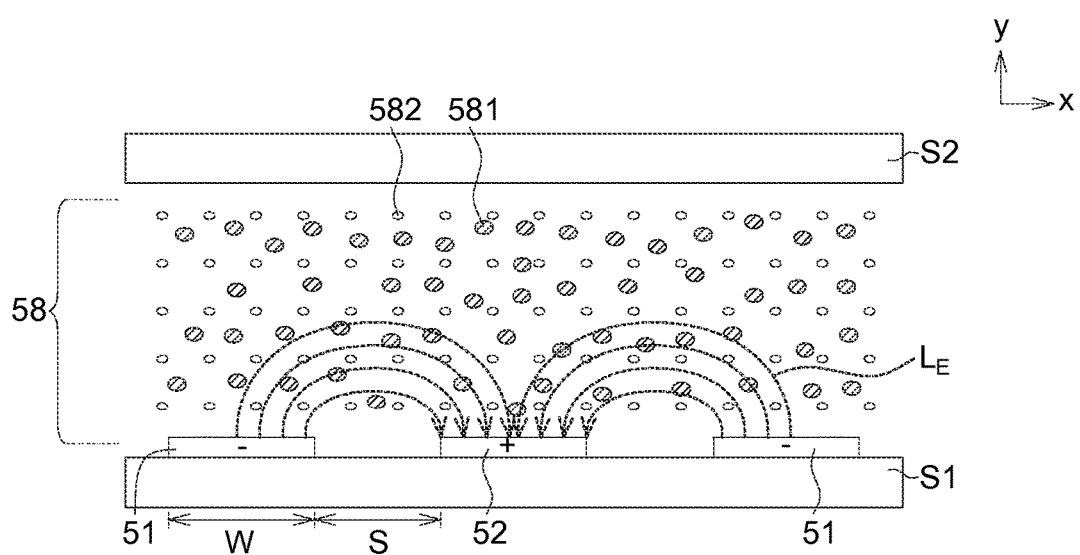
FIG. 10A is a cross-sectional view of a display according to the eighth embodiment of the disclosure.

FIG. 10A is a cross-sectional view of a display according to the eighth embodiment of the disclosure. As shown in FIG. 10A, the display 50 comprises a first substrate S1, a second substrate S2, an electrode structure formed on one side of the first substrate S1, and a light-emitting combination layer 58 positioned between the first substrate S1 and the second substrate S2. The electrode structure comprises a plurality of pixel electrodes 51 formed at a first side of the first substrate S1 and opposite to the second substrate S2, and the adjacent pixel electrodes 51 are spaced apart from each other. The electrode structure further comprises a common electrode 52 disposed at the first side of the first substrate S1, and the pixel electrodes 51 are spaced apart from the common electrode 52. As shown in FIG. 10A, one of the electrodes (such as the pixel electrode 51) has a width W, and the adjacent electrodes such as the pixel electrode 51 and the common electrode 52 has a spacing S. A horizontal electric field is generated when the voltage is applied to the electrode structure. Also, FIG. 10A depicts a distribution of the electric field lines ($L_E$) when a voltage is applied to the pixel electrodes 51 (ex: negative voltage) and the common electrode 52 (ex: positive voltage).

Practically, the common electrode and the pixel electrodes can be disposed at the same layer or different layers, and the present disclosure has no particular limitation thereto. In the eighth embodiment, the common electrode and the pixel electrodes are disposed at the same layer for illustration.

Similarly, the light-emitting combination layer 58 of the display 50 at least comprises a light emitting material 581 and a liquid crystal material 582. The liquid crystals with the self-assembled structure or non-self-assembled structure can be adopted as the liquid crystal material 582 of the light-emitting combination layer 58. The non-self-assembled liquid crystals (i.e. general liquid crystals) are exemplified in the eighth embodiment. In one embodiment, the light emitting material 581 is an organic light emitting material. The light-emitting combination layer 58 is the light-emitting layer of the display 50. When a voltage or electric current is applied for driving the display 50, electrons and holes are injected into the light-emitting combination layer 58. When electrons and holes are recombined, the light known as electroluminescence is emitted from the light emitting material 581.

The related experiment is conducted for investigating an embodied display 50 (no alignment film) as shown in FIG. 10A. A distance between tow substrates is 3.25 μm, a width W of the electrode and a spacing S between adjacent electrodes are 5 μm. The light emitting material 581 is about 0.01 wt % of the total weight of the light-emitting combination layer 58 (including the light emitting material 581 and the liquid crystal material 582). A driving voltage of 70V (0.458 mA, 60 Hz) is applied to activate the light emitting material 581 for electroluminescence. According to the results, the emission uniformity and the lighting efficiencies of the display of FIG. 10A are significantly increased. Other experiments, such as varying the values and ratio of the width W and spacing S, changing the adding ratios of the light emitting material to the light-emitting combination layer, are also conducted, and the results also prove that the emission uniformity and the lighting efficiencies of the embodied display are significantly improved. It is assumed that a total weight of the light-emitting combination layer is defined as weights of the light emitting material and the liquid crystal material. In one embodiment, the light emitting material is about 0.01 wt %~about 10 wt % of the total weight of the light-emitting combination layer. In another embodiment, the light emitting material is about 0.01 wt %~about 1 wt % of the total weight of the light-emitting combination layer. However, those values can be adjusted depending on the selections of the light emitting material and the liquid crystal material, and the present invention is not limited to those disclosed values and ranges.

Figure 10B:
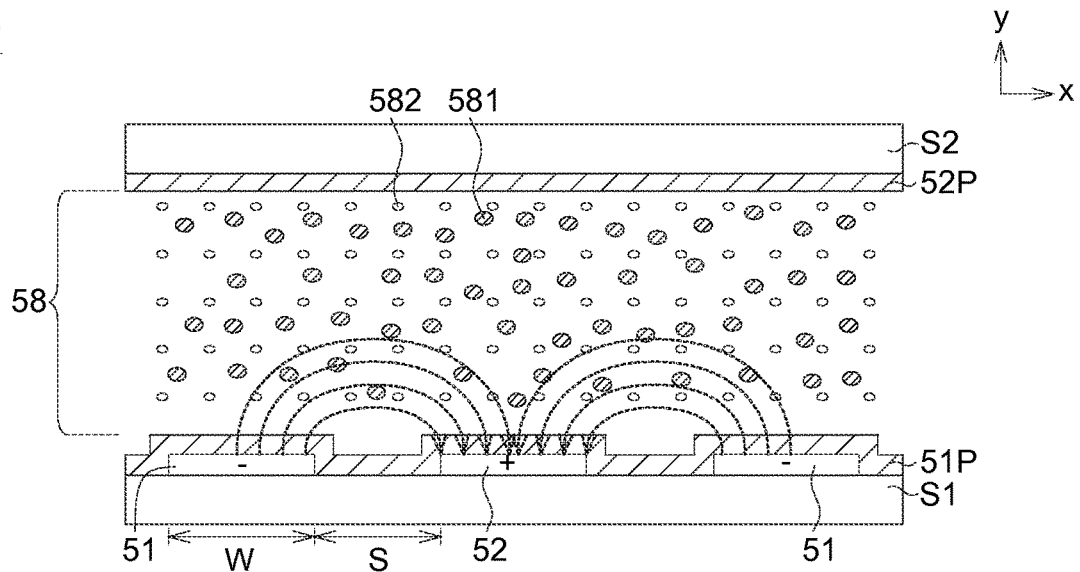
FIG. 10B is a cross-sectional view of another display according to the eighth embodiment of the disclosure.

FIG. 10B is a cross-sectional view of another display according to the eighth embodiment of the disclosure. The difference between the devices of FIG. 10A and FIG. 10B is the device 50' of FIG. 10B comprising the alignment films. As shown in the device 50' of FIG. 10B, the first alignment film 51P is formed on the first substrate S1, and the second alignment film 52P is formed on the pixel electrodes 51 and the common electrode 51. Alternatively, the alignment film can be disposed at the side of electrodes only. The present invention has no particular limitation thereto. The emission uniformity and the lighting efficiencies of the display with the alignment film(s) can be significantly improved.

Figure 10C:
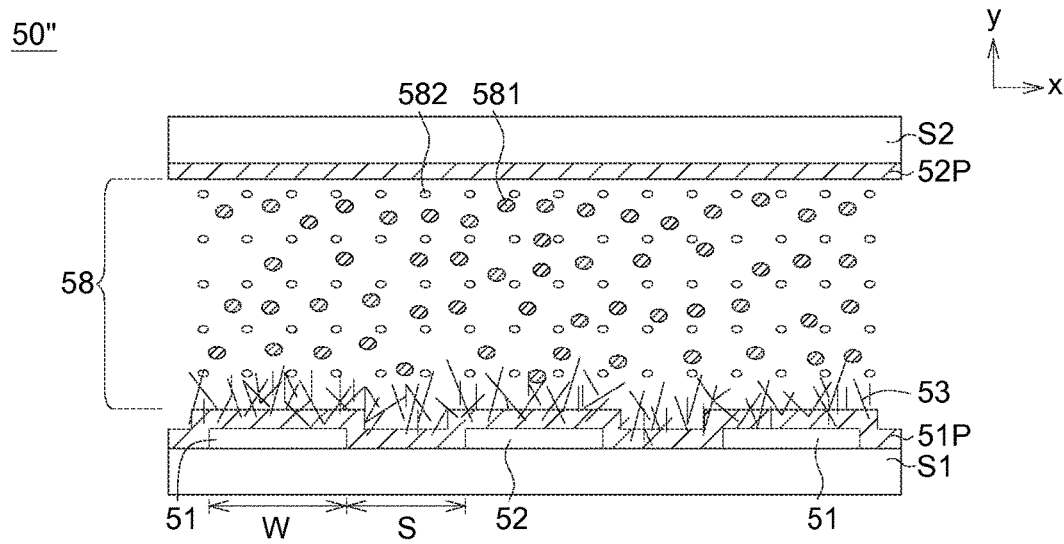
FIG. 10C is a cross-sectional view of still another display according to the eighth embodiment of the disclosure.

FIG. 10C is a cross-sectional view of still another display according to the eighth embodiment of the disclosure. The difference between the devices of FIG. 10B and FIG. 10C is the device 50" of FIG. 10C comprising the alignment film (i.e. the second alignment film 52P) distributed with the conductors 53, such as carbon nano-tubes. In the embodiment, the long axes of the conductors 53 are oriented vertically (such as oriented substantially towards the first substrate S1). It is observed that the defect of non-uniform light intensity caused by the point discharge at the electrode corners can be significantly improved due to the conductors 53 distributed in the second alignment film 52P.

<Ninth Embodiment>

Figure 11A:
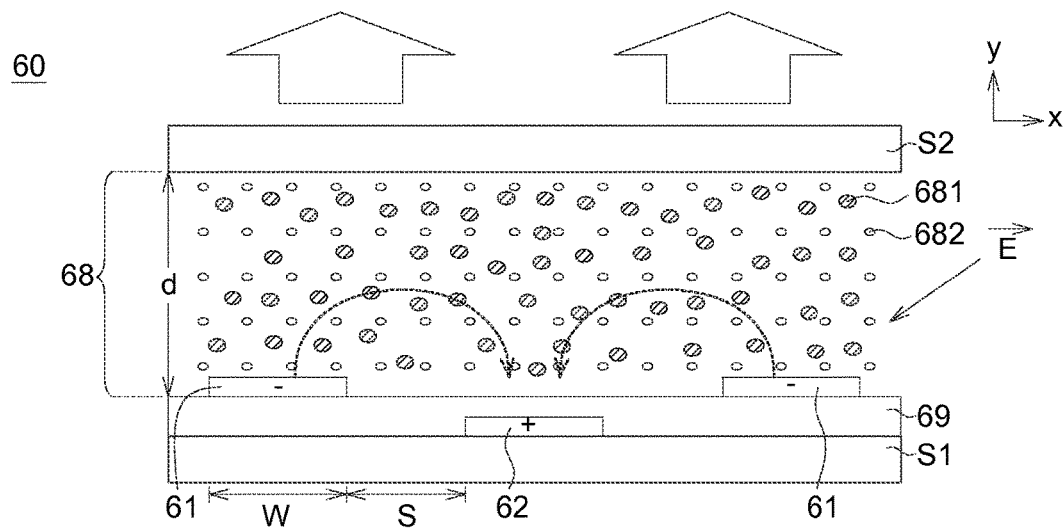
FIG. 11A is a cross-sectional view of a display according to the ninth embodiment of the disclosure.

The difference between the devices of the ninth embodiment and the eighth embodiment is the positions of the common electrode and the pixel electrodes. In the ninth embodiment, the common electrode and the pixel electrodes of the device (such as a device with IPS mode) are disposed at different layers. FIG. 11A is a cross-sectional view of a display according to the ninth embodiment of the disclosure. As shown in the device 60 of FIG. 11A, the common electrode 62 is separated from the pixel electrodes 61 by an insulating layer 69. Other identical elements of the display have been described in the eighth embodiment, and not redundantly described herein.

Figure 11B:
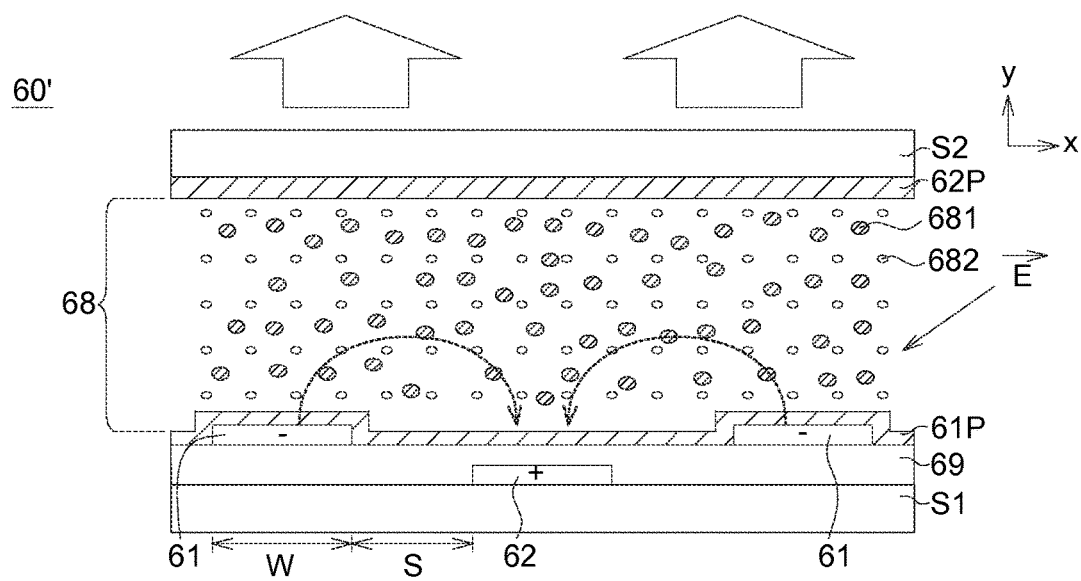
FIG. 11B is a cross-sectional view of another display according to the ninth embodiment of the disclosure.

FIG. 11B is a cross-sectional view of another display according to the ninth embodiment of the disclosure. The difference between the devices of FIG. 11A and FIG. 11B is the device 60' of FIG. 11B comprising the alignment films. As shown in the device 60' of FIG. 11B, the first alignment film 61P is formed on the first substrate S1, and the second alignment film 62P is formed on the pixel electrodes 61. Alternatively, the alignment film can be disposed at the side of the pixel electrodes 61 only. The present invention has no particular limitation thereto. The emission uniformity and the lighting efficiencies of the display with the alignment film(s) can be significantly improved.

Figure 11C:
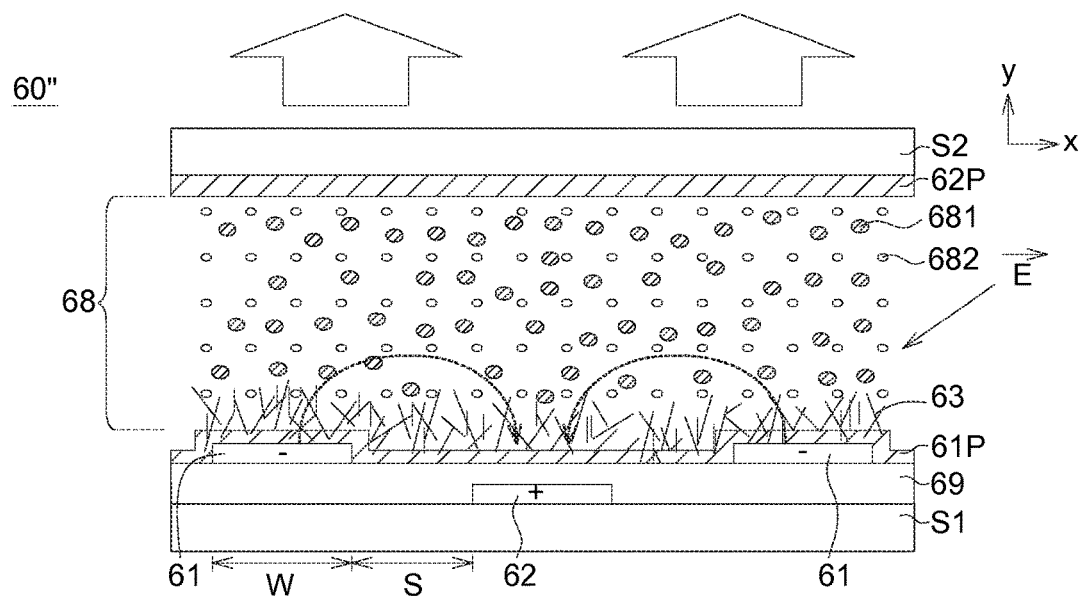
FIG. 11C is a cross-sectional view of still another display according to the ninth embodiment of the disclosure.

FIG. 11C is a cross-sectional view of still another display according to the ninth embodiment of the disclosure. The difference between the devices of FIG. 11B and FIG. 11C is the device 60" of FIG. 11C comprising the alignment film (i.e. the second alignment film 62P) distributed with the conductors 63, such as carbon nano-tubes. In the embodiment, the long axes of the conductors 63 are oriented vertically. It is observed that the defect of non-uniform light intensity caused by the point discharge at the electrode corners can be significantly improved due to the conductors 63 distributed in the alignment film.

<Tenth Embodiment>

Similar to the ninth embodiment, the common electrode and the pixel electrodes of the device (such as a device with AFFS mode) of the tenth embodiment are disposed at different layers. However, the material selections for the electrodes are different. In the ninth embodiment, the common electrode 62 and the pixel electrodes 61 are metal electrodes. In the tenth embodiment, the pixel electrodes 71 are metal electrodes, and the common electrode 72 is a transparent conductive layer.

Figure 12A:
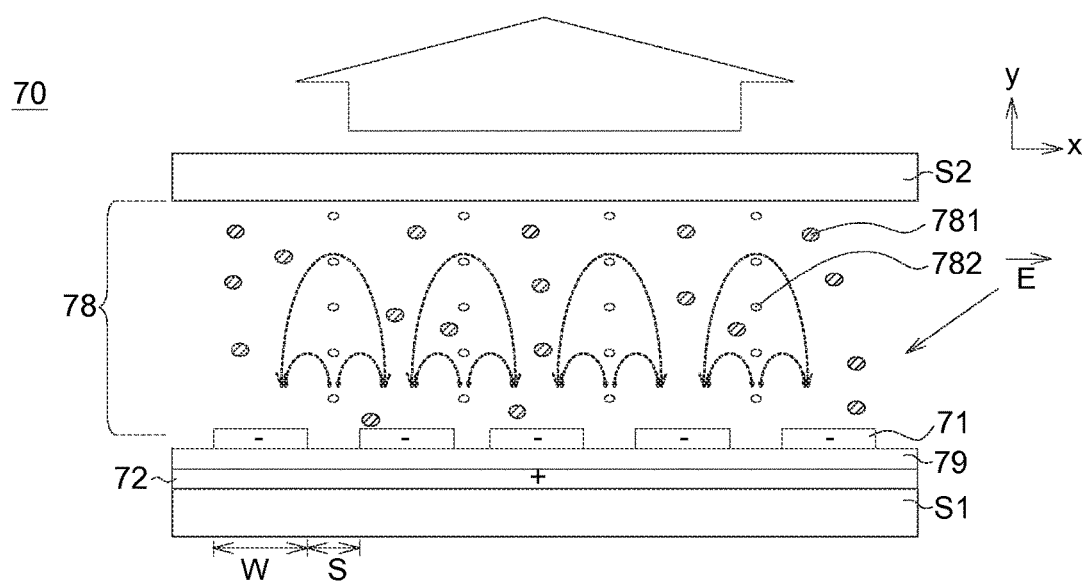
FIG. 12A is a cross-sectional view of a display according to the tenth embodiment of the disclosure.
Figure 12B:
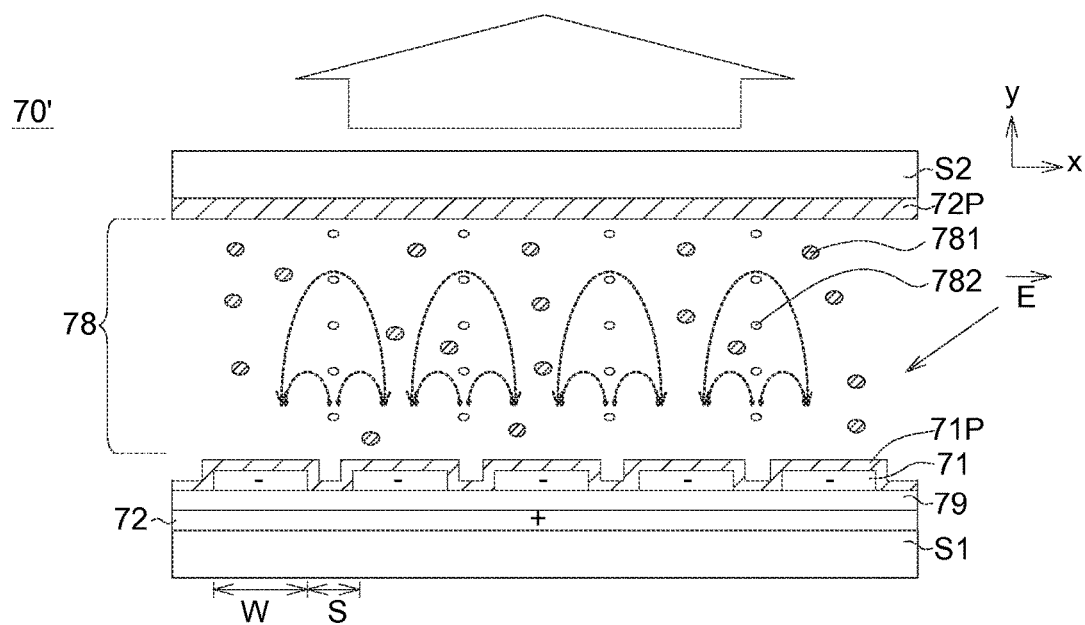
FIG. 12B is a cross-sectional view of another display according to the tenth embodiment of the disclosure.
Figure 12C:
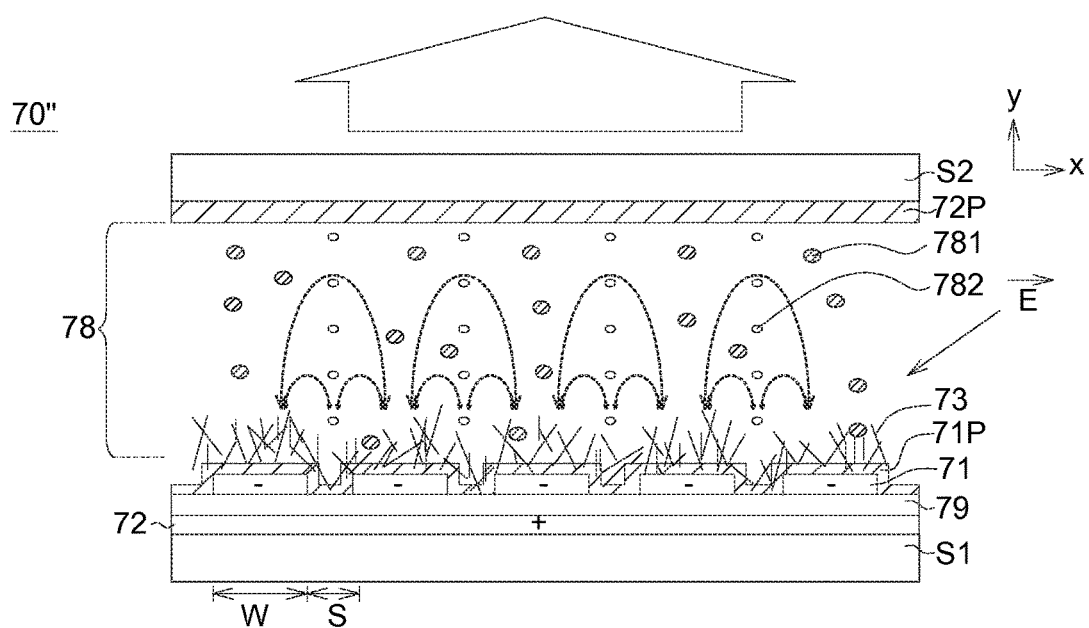
FIG. 12C is a cross-sectional view of still another display according to the tenth embodiment of the disclosure.

FIG. 12A is a cross-sectional view of a display according to the tenth embodiment of the disclosure. As shown in the device 70 of FIG. 12A, the common electrode 72 is separated from the pixel electrodes 71 by an insulating layer 79. Other identical elements of the displays designed with the same reference numbers have been described in the eighth embodiment, and not redundantly described herein. FIG. 12B is a cross-sectional view of another display according to the tenth embodiment of the disclosure. The difference between the devices of FIG. 12A and FIG. 12B is the device 70' of FIG. 12B comprising the alignment films, such as the first alignment film 71P formed on the first substrate S1 and the second alignment film 72P formed on the pixel electrodes 71. Alternatively, the alignment film can be disposed at the side of the pixel electrodes 71 only, and the present invention has no particular limitation thereto. The emission uniformity and the lighting efficiencies of the display with the alignment film(s) can be significantly improved. FIG. 12C is a cross-sectional view of still another display according to the tenth embodiment of the disclosure. The difference between the devices of FIG. 12B and FIG. 12C is the device 70" of FIG. 12C comprising the alignment film (i.e. the second alignment film 72P) distributed with the conductors 73, such as carbon nano-tubes. It is observed that the alignment film distributed with the conductors 73 does significantly improve the emission uniformity and the lighting efficiencies of the display.

Additionally, the light-emitting combination layers 58/68/78 of the displays of the eighth to tenth embodiments can further comprise an electron injection material, or a hole injection material, or both of them. Alternatively, an electron injection layer and/or a hole injection layer can be optionally incorporated into the embodied displays for improving the lighting performance of the device. Moreover, the display may further comprises a light-shielding layer (i.e. the black matrix, BM) on the second substrate S2 if the metal electrodes are adopted (as the data lines/gate lines), for preventing the undesired lighting output from the device.

The present disclosure can be widely used in various applications. The embodiments below illustrate a displaying apparatus capable of adjusting and controlling the polarization of light by applying an embodied device as described above.

<Application-Displaying Apparatus Adjusting and Controlling Polarization of Light>

In a displaying apparatus of this application, ferroelectric liquid crystals (FLC) is selected as the liquid crystal material of the light-emitting combination layer of the display, and other components such as a phase retarder and a polarization state switching module are incorporated into the displaying apparatus for adjusting and controlling the polarization of light of the displaying apparatus. In this application, the back light source and polarized plates can be omitted from the displaying apparatus by applying this technique of controlling light polarization. Also, the displaying apparatus of the application is easy to be fabricated, and it can be widely used in the fields of the large-sized displays and the flexible displays.

In this application, when a voltage or electric current is applied for driving the LC cell, electrons and holes are injected into the light-emitting combination layer 58. When electrons and holes are recombined, the light known as electroluminescence is emitted from the light emitting material. Under an electric field, the LC molecules of the light-emitting combination layer would lead the light-emitting material to align orderly. Also, the FLC molecules possesses the optical characteristics of not isotropic reflection indices ($n_e$, $n_o$). When the LC cell receives an electric signal, the light emitted from the light emitting material penetrates the FLC molecules and generates the polarized lights in particular directions. Then, the polarization directions of the polarized lights are controlled by altering the directions of the electric fields, so as to generate light with different intensities in two polarization directions.

Generally, the nematic LC molecules are aligned with a special order. For the ferroelectric liquid crystal (FLC) molecules exemplified as the LC material of the light-emitting combination layer herein, the tilt directions of FLC molecules precesses in a helical fashion in space as the varied azimuthal angles of FLC molecules moving along the layer normal from layer to layer are observed. An angle exhibits between the FLC molecules at the adjacent layers. The distance between an initial position and a next position of the FLC molecule having the same tilted condition is so-called as a pitch of the helix.

Figure 13A:
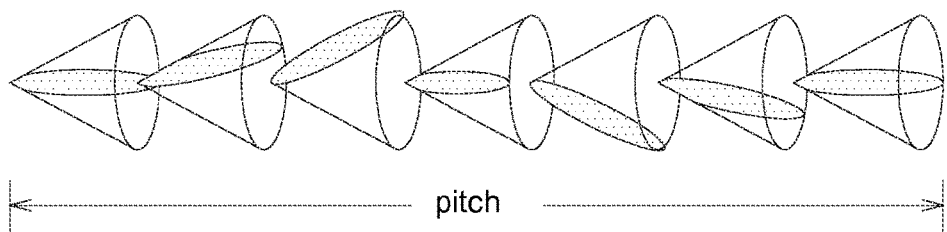
FIG. 13A depicts an orientation of ferroelectric liquid crystal molecules within one pitch.
Figure 13B:
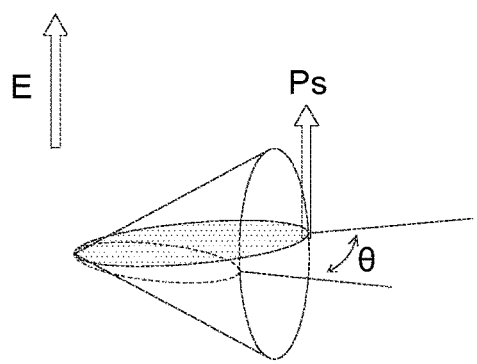
FIG. 13B illustrates the direction of spontaneous polarization (Ps) of the ferroelectric liquid crystal molecules oriented same as the upward direction of the electric field in the application.
Figure 13C:
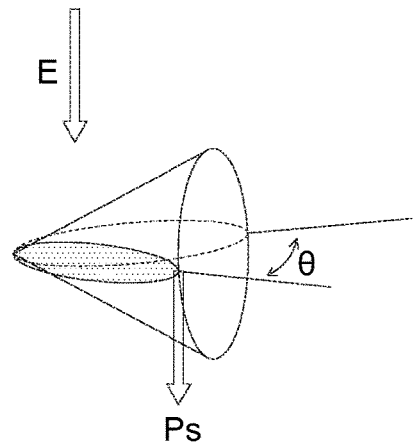
FIG. 13C illustrates the direction of spontaneous polarization (Ps) of the ferroelectric liquid crystal molecules oriented same as the downward direction of the electric field in the application.

FIG. 13A depicts an orientation of ferroelectric liquid crystal molecules within one pitch. Take nematic liquid crystals ($\Delta\epsilon > 0$) under an electrical field for example. The long axes of the nematic liquid crystal molecules are oriented parallel to the direction E of the electric field, and the direction of spontaneous polarization (Ps) of the FLC molecules are oriented towards the same direction of the electric field. As shown in FIG. 13B and FIG. 13C, which respectively illustrate the directions of spontaneous polarization (Ps) of the ferroelectric liquid crystal molecules oriented same as the upward and downward directions of the electric fields in the application.

Figure 14A:
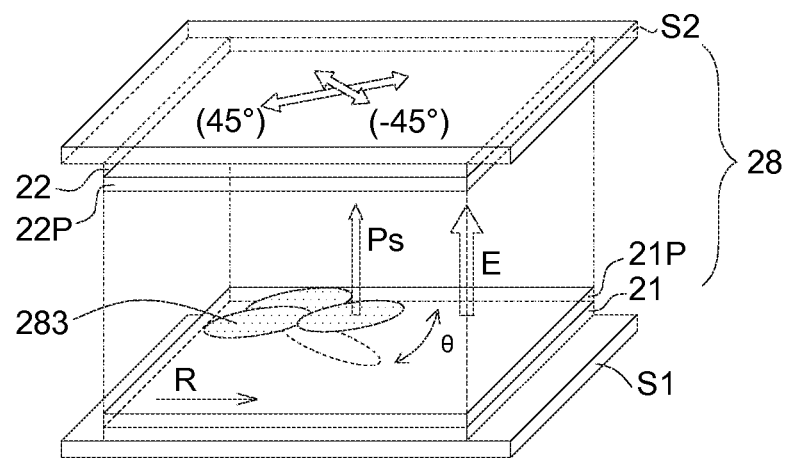
FIG. 14A and FIG. 14B illustrate polarized lights in the particular directions when the displays are applied by the electric fields having directions upward and downward, respectively.
Figure 14B:
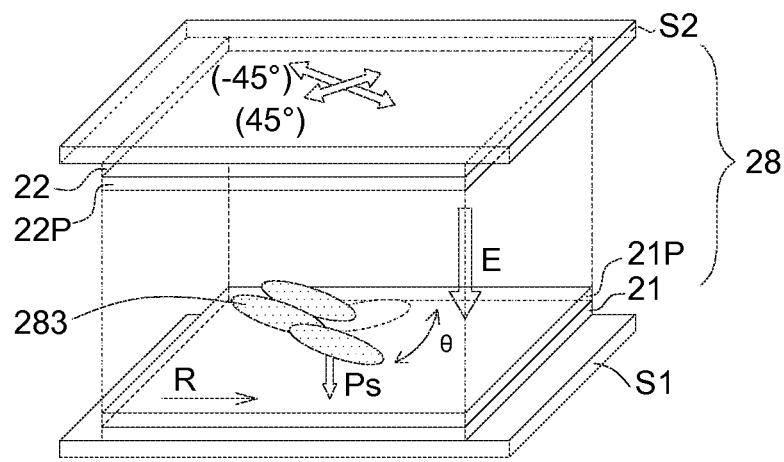

FIG. 14A and FIG. 14B illustrate polarized lights in the particular directions when the displays are applied by the electric fields having directions upward and downward, respectively. The elements of the displays of FIG. 14A and FIG. 14B identical to that of FIG. 3 of the second embodiment are designated by the same reference number. As shown in FIG. 14A and FIG. 14B, the display comprises a first electrode 21 formed on a first substrate S1, a second electrode 22 formed on a second substrate S2, a first alignment film 21P formed on the first electrode 21, a second alignment film 22P formed on the second electrode 22, and a light-emitting combination layer 28 positioned between the first alignment film 21P and the second alignment film 22P. The first electrode 21 and the second electrode 22 can be the full conductive plates, such as full ITO layers. Also, R represents the rubbing direction of the alignment films, and E represents the direction of the electric field. In this application, the light-emitting combination layer 28 at least comprises ferroelectric liquid crystals (liquid crystal material) and a light emitting material. When a voltage or electric current is applied for driving the display (the first electrode 21 coupled to the second electrode 22), electrons and holes are injected into the light-emitting combination layer 28. When electrons and holes are recombined, the light (electroluminescence) is emitted from the light emitting material. The light emitting material is not depicted in FIG. 14A and FIG. 14B, and the details of the light emitting material have been described in the embodiments above, which are not redundantly repeated.

In this application, the light emitting material is mixed with the ferroelectric liquid crystals to form a mixture, and the mixture is then injected into a LC cell as depicted in FIG. 14A or FIG. 14B, wherein a gap of the LC cell is less then 5 μm. Alignment of the LC cell can be accomplished by photo-alignment or rubbing alignment. Alignment directions of the alignment films can be two opposite directions or the same directions. When the LC cell receives an electric signal by applying a voltage (ex: less than 20V), the direction of spontaneous polarization (Ps) of the FLC molecules is oriented towards the same direction of the electric field. As shown in FIG. 14A and FIG. 14B, the directions of spontaneous polarization (Ps) are vertically upward and downward when the electric fields with upward and downward directions are respectively applied to the LC cells, so that the FLC molecules are rotated on the substrate with an angle θ of 90 degree. When the LC cell receives an electric signal, the light emitted from the light emitting material of the light-emitting combination layer penetrates the FLC molecules and generates the polarized lights in the particular directions, due to the optical characteristics of not isotropic reflection indices ($n_e$, $n_o$) of FLC molecules.

Additionally, the polarization directions of the polarized lights can be controlled by switching the directions of the electric fields. As shown in FIG. 14A, an electric field with the upward direction is applied, and two light components with different polarization directions are generated, and the light component along 45 degree of the polarization direction has larger quantity, and the other light component along −45 degree of the polarization direction has smaller quantity. When the electric field is switched to the downward direction, the generated light component along −45 degree of the polarization direction has larger quantity, while the other light component along 45 degree of the polarization direction has smaller quantity, as shown in FIG. 14B. Since the FLC molecules exhibit the attractive feature of fast response time (milliseconds), the control of the polarization of light can be quickly achieved.

Moreover, a phase retarder can be disposed above the second substrate, and a polarization state switching module can be disposed above the phase retarder, wherein the polarization state switching module possesses switchable states, such as a first state and a second state. The switchable states of the polarization state switching module can be determined and set according to the actual needs of the practical applications, for enabling the switch of two states. The polarization of light output from the displaying apparatus can be controlled by using the phase retarder and the polarization state switching module. Accordingly, a first light is generated when the linearly polarized light as shown in FIG. 14A and FIG. 14B passes through the phase retarder, and the first light is then passes through the polarization state switching module in a first state or a second state to generate a second light with a first polarization direction or a second polarization direction, respectively.

In one example, a phase retarder (such as a quarter wave plate) is added into the structure as shown in FIG. 14A and FIG. 14B to change the electroluminescent light into the left-handed/right-handed circularly polarized light. Also, a two-layered cholesteric liquid crystal (CLC) assembly (and arrangements of the upper layer and the lower layer of cholesteric liquid crystals are controlled independently) is selected as the polarization state switching module disposed on the phase retarder. Due to the existence of the periodic structure of CLC molecules, cholesteric liquid crystals exhibit the remarkable properties such as Bragg reflection (selective light reflections), and the polarization state switching module functions as circular polarization filter. The bandwidth $\Delta\lambda$ of Bragg reflection is given by: $\Delta\lambda = p \times \Delta n = 400 \sim 700$ nm, where $\Delta n$ is the birefringence of the uniaxially oriented phase corresponding to the CLC. Accordingly, the state of the circularly polarized light of the displaying apparatus can be controlled by using the quarter wave plate and the two-layered CLC assembly.

Figure 15A:
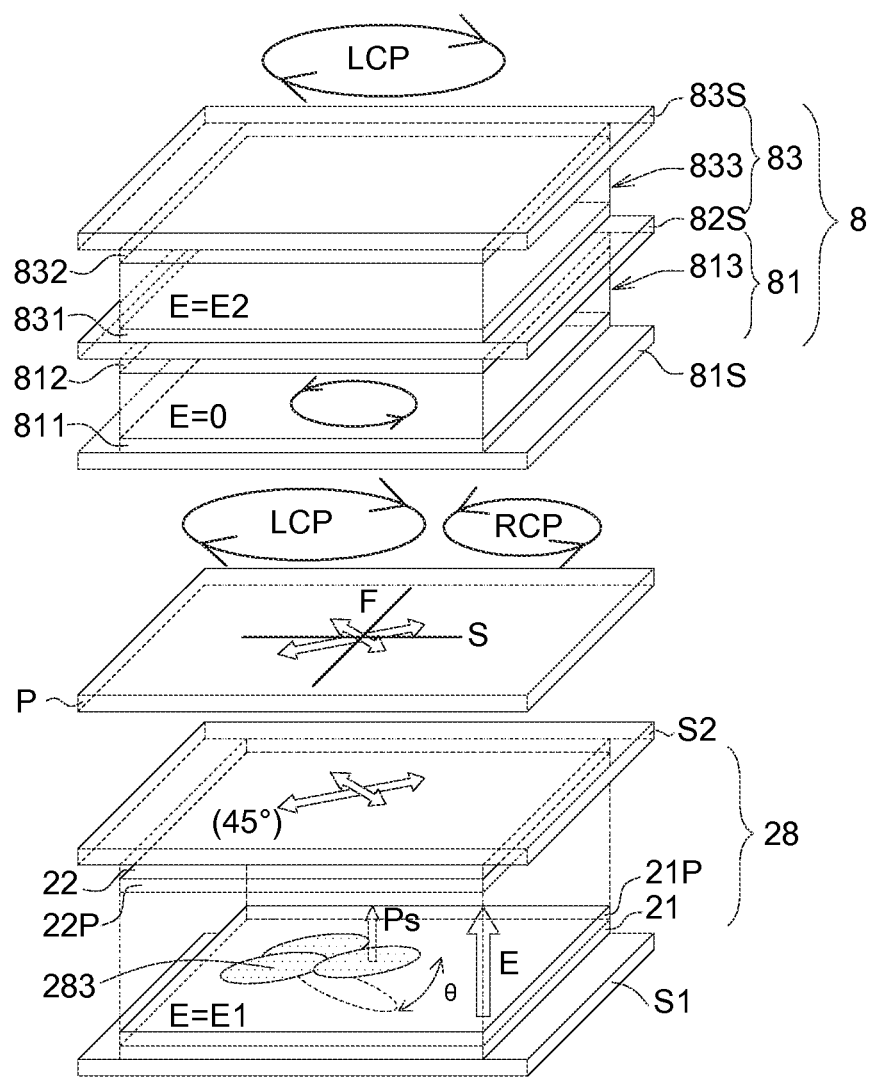
FIG. 15A illustrates a displaying apparatus functioning as a circular polarization filter according to one of applications of the present disclosure, wherein a left-handed circularly polarized (LCP) light is exited from the polarization state switching module.
Figure 15B:
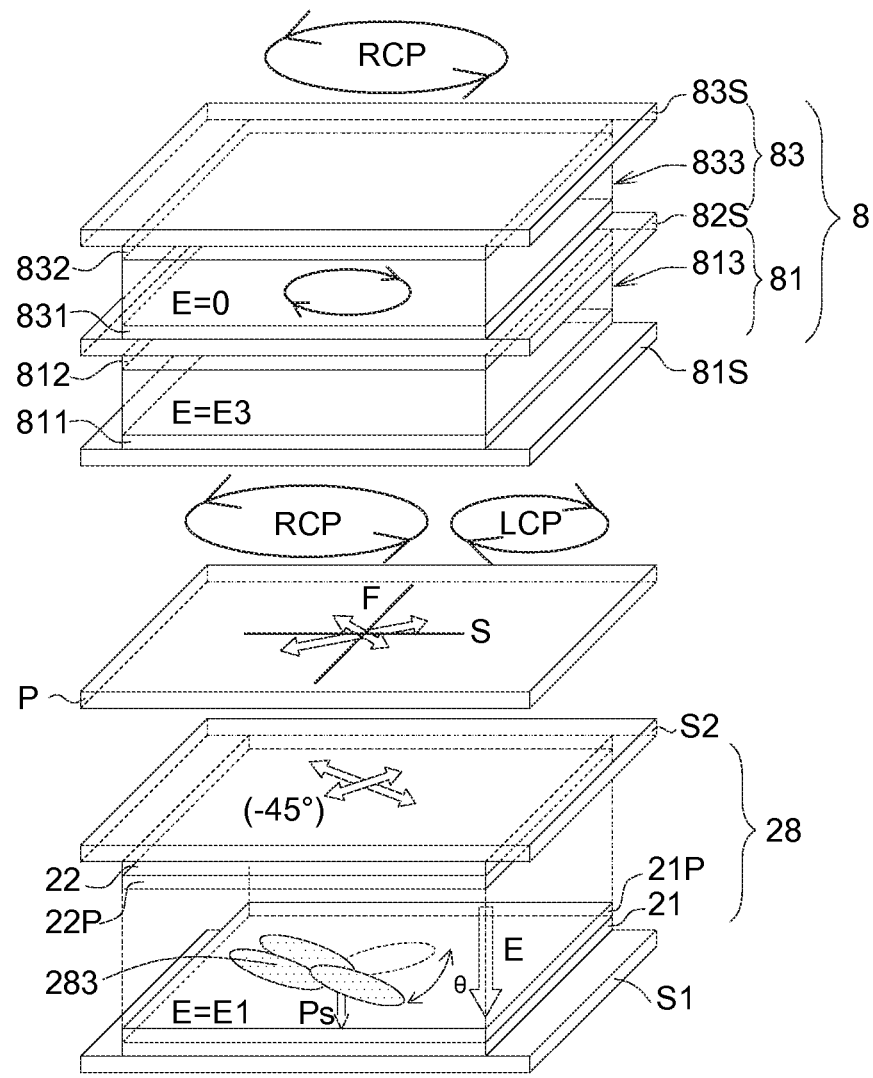
FIG. 15B illustrates a displaying apparatus functioning as a circular polarization filter according to one of applications of the present disclosure, wherein a right-handed circularly polarized (RCP) light is exited from the polarization state switching module.

FIG. 15A illustrates a displaying apparatus functioning as a circular polarization filter according to one of applications of the present disclosure, wherein a left-handed circularly polarized (LCP) light is exited from the polarization state switching module. FIG. 15B illustrates a displaying apparatus functioning as a circular polarization filter according to one of applications of the present disclosure, wherein a right-handed circularly polarized (RCP) light is exited from the polarization state switching module. Also, the displays of FIG. 14A and FIG. 14B are respectively depicted in the displaying apparatus of FIG. 15A and FIG. 15B.

In FIG. 15A and FIG. 15B, the polarization state switching module of one application is a two-layered CLC assembly 8, comprising a lower-layered CLC structure 81 and an upper-layered CLC structure 83 stacked on the lower-layered CLC structure 81. Also, the two-layered CLC assembly 8 has switchable the first state and the second state, so that a second light with a left-handed circular polarization (LCP) state or a right-handed circular polarization (RCP) state can be respectively exited after a first light existed from the phase retarder passes through the two-layered CLC assembly 8. In one application, the lower-layered CLC structure 81 comprises a lower substrate 81S, a middle substrate 82S, the electrodes 811 and 812, and a lower layer 813 of cholesteric liquid crystals positioned between the the electrodes 811 and 812. The upper-layered CLC structure 83 comprises the middle substrate 82S, an upper substrate 83S, the electrodes 831 and 832, and an upper layer 833 of cholesteric liquid crystals positioned between the the electrodes 831 and 832. As shown in FIG. 15A, the electrodes 812 and 831 are positioned at the opposite sides of the middle substrate 82S.

In this application, when no electric field is applied to the lower-layered CLC structure 81, the lower layer 813 of cholesteric liquid crystals presents the right-handed circular polarization (RCP) state, as shown in FIG. 15A. When no electric field is applied to the upper-layered CLC structure 83, the upper layer 833 of cholesteric liquid crystals presents the left-handed circular polarization (LCP) state, as shown in FIG. 15B. Since the electric fields for the upper-layered CLC structure 83 and the lower-layered CLC structure 81 are independently applied, the arrangements of the upper layer 833 of cholesteric liquid crystals and the lower layer 813 of cholesteric liquid crystals can be controlled separately as two independent LC layers. It is noted that the application type of the present disclosure is not limited to the condition depicted in FIG. 15A and FIG. 15B. In an alternative example, the lower layer 813 of cholesteric liquid crystals can present the LCP state when no electric field is applied to the lower-layered CLC structure 81, while the upper layer 833 of cholesteric liquid crystals can present the RCP state.

Please refer to FIG. 15A, which adopts the display of FIG. 14A. In FIG. 15A, when a vertical electric field having a first electric field direction (E upward) is generated due to the voltage applied to the electrode structure of the display (i.e. display of FIG. 14A), an electroluminescent light from the light emitting material passes the phase retarder (i.e. a quarter wave plate) P and outputs a first light comprising components of the left-handed (i.e. the first polarized direction) circularly polarized (LCP) light and the right-handed (i.e. the second polarized direction) circularly polarized (RCP) light, wherein the LCP light component has larger quantity than the RCP light component. Furthermore, the two-layered CLC assembly 8 (i.e. the polarization state switching module) is set in the first state. In one embodiment, it is assumed the first state of the two-layered CLC assembly 8 that the cholesteric liquid crystals of the upper-layered CLC structure 83 exhibit a non-polarization state by applying a voltage less than 100V to the upper-layered CLC structure 83 having a gap smaller than 10 μm, while the cholesteric liquid crystals of the lower-layered CLC structure 81 still presents the right-handed circular polarization (RCP) state by applying no electric field to the lower-layered CLC structure 81 having a gap smaller than 10 μm. When the first light existed from the phase retarder (i.e. a quarter wave plate) P passes through the two-layered CLC assembly 8, a second light with a left-handed circular polarization (LCP) state can be exited from the two-layered CLC assembly 8.

Please refer to FIG. 15B, which adopts the display of FIG. 14B. In FIG. 15B, when a vertical electric field having a second electric field direction (E downward) is generated due to the voltage applied to the electrode structure of the display (i.e. display of FIG. 14B), an electroluminescent light from the light emitting material passes the phase retarder (i.e. a quarter wave plate) P and outputs a first light comprising components of the left-handed (i.e. the first polarized direction) circularly polarized (LCP) light and the right-handed (i.e. the second polarized direction) circularly polarized (RCP) light, wherein the RCP light component has larger quantity than the LCP light component. Furthermore, the two-layered CLC assembly 8 (i.e. the polarization state switching module) is switched to the second state. In one embodiment, it is assumed the second state of the two-layered CLC assembly 8 that the cholesteric liquid crystals of the lower-layered CLC structure 81 exhibit a non-polarization state by applying a voltage less than 100V to the lower-layered CLC structure 81 having a gap smaller than 10 μm, while the upper-layered CLC structure 83 still presents the left-handed circular polarization (LCP) state by applying no electric field to the upper-layered CLC structure 83 having a gap smaller than 10 μm. When the first light existed from the phase retarder (i.e. a quarter wave plate) P passes through the two-layered CLC assembly 8, a second light with a right-handed circular polarization (RCP) state can be exited from the two-layered CLC assembly 8.

According to the aforementioned descriptions, the display of the embodiment is an emissive display without using the traditional backlight unit as a light source. Also, the embodiment can be widely applied to various types of displays, including the displays with vertical or horizontal electric fields during the operation. According to the embodiments, the crystal liquid material of the light-emitting combination layer can be arranged particularly (such as having the periodic structures illustrated in the first to fourth embodiments) to improve the light efficiency and the uniformity of light distribution. However, it is noted that the ordinary crystal liquid materials can be applicable in the displays of the embodiments (such as illustrated in the fifth to tenth embodiments). Also, the operation voltage for conducting the electroluminescence of the embodied device is not sufficient to affect the arrangement of the crystal liquid molecules, so that the crystal liquid molecules exhibit a stable structure (such as the periodic structure), and the excellent properties of the embodied device such as great light efficiency and uniform light distribution can still be acquired even when the embodied display is operated repeatedly. Moreover, it is observed that the alignment film constructed in the device, with or without the conductors distributed therein, does significantly improve the emission uniformity and the lighting efficiencies of the display of the embodiment.

In the aforementioned embodiments, liquid crystals with the self-assembled periodic structure (such as one-dimensional FLC molecules, three-dimensional BPLC molecules) or non-dimensional periodic structure can be adopted as the liquid crystal material of the light-emitting combination layer. Also, liquid crystals with the non-self-assembled structure, such as liquid crystals with non-periodic structure, can be adopted as the liquid crystal material of the light-emitting combination layer. There is no particular limitation to the LC materials of the embodied devices in the applications. Moreover, the liquid crystal material may further comprise the polymer net to form the polymer-stabilized liquid crystals for stabilizing the LC molecules, depending on the LC selection for the applications. Examples of the applicable liquid crystal of the embodiments include polymer-stabilized blue phase (BP) liquid crystals (with a polymer net to stabilize BP LC molecules), ferroelectric liquid crystals, polymer-stabilized ferroelectric liquid crystals (with a polymer net to stabilize FLC molecules), liquid crystals without chirality, polymer-stabilized liquid crystals without chirality, and so on. Accordingly, selections of the LC materials of the embodied devices, as well as the adequate polymers for stabilizing the LC molecules and/or distributing the light emitting material, are not particularly limited, and can be optionally determined according to the design requirements of the practical applications.

In the embodied devices of the practical applications, the material of the electrode structure, the light emitting material, and the numbers/materials of the electron injection layer and the hole transport layer are no particularly limited. Also, there are no particular limitations to the numbers/materials of the electron injection material and the hole transport material for adding into the light-emitting combination layer. Any materials and numbers of the layers constructed in the embodied device capable of achieving the emissive purpose in response to the electric current are all applicable for the devices.

Additionally, the embodied display of the present disclosure can be widely used in various applications; for example, one application illustrates a displaying apparatus capable of adjusting and controlling the polarization of light by applying an embodied device as described above. In this application, the back light source and polarized plates can be omitted from the displaying apparatus by applying this technique of controlling light polarization. Also, the displaying apparatus of the application is easy to be fabricated, and it can be widely used in the fields of the large-sized displays and the flexible displays.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
a first substrate;
a second substrate opposite to the first substrate;
an electrode structure, comprising a first electrode disposed on the first substrate and a second electrode disposed on the second substrate, wherein a vertical electric field is generated when a voltage is applied to the first electrode and the second electrode; and
a light-emitting combination layer, positioned between the first electrode and the second electrode, and the light-emitting combination layer comprising a light emitting material and a liquid crystal material;
wherein the liquid crystal material comprises liquid crystals in a periodic structure.

2. The display according to claim 1, further comprising:
an electron injection layer (EIL), formed on the first electrode; and
a hole transport layer (HTL), formed on the second electrode,
wherein the light-emitting combination is positioned between the electron injection layer and the hole transport layer.

3. The display according to claim 1, wherein the light-emitting combination layer further comprises at least one of an electron injection material and a hole injection material, or both thereof.

4. A display, comprising:
a first substrate;
a second substrate opposite to the first substrate;
an electrode structure, comprising a first electrode disposed on the first substrate and a second electrode disposed on the second substrate, wherein a vertical electric field is generated when a voltage is applied to the first electrode and the second electrode; and
a light-emitting combination layer, positioned between the first electrode and the second electrode, and the light-emitting combination layer comprising a light emitting material and a liquid crystal material, wherein the liquid crystal material comprises ferroelectric liquid crystals.

5. The display according to claim 4, further comprising:
a phase retarder, disposed above the second substrate; and
a polarization state switching module, disposed above the phase retarder, and the polarization state switching module possessing switchable states comprising a first state and a second state.

6. The display according to claim 5, wherein the phase retarder is a quarter wave plate.

7. The display according to claim 6, wherein the polarization state switching module comprises a two-layered cholesteric liquid crystal (CLC) assembly having switchable the first state and the second state, so that a second light with a left-handed circular polarization (LCP) state or a right-handed circular polarization (RCP) state is exited after a first light passes through the polarization state switching module.

8. The display according to claim 7, wherein the polarization state switching module comprises:
an upper-layered CLC structure and a lower-layered CLC structure, and the upper-layered CLC structure is spatially stacked on the lower-layered CLC structure,
wherein the upper-layered CLC structure comprises an upper layer of cholesteric liquid crystals,
the lower-layered CLC structure comprises a lower layer of cholesteric liquid crystals,
when no electric field exists, the upper-layered CLC structure comprises one of left-handed or right-handed cholesteric liquid crystals, while the lower-layered CLC structure comprises the other one thereof,
wherein arrangements of the upper layer and the lower layer of cholesteric liquid crystals are controlled independently.

9. The display according to claim 6, wherein an exited light at the first state of the polarization state switching module is one of a left-handed circularly polarized (LCP) light and a right-handed circularly polarized (RCP) light, while the exited light at the second state is the other of the LCP light and the RCP light.

10. A display, comprising:
a first substrate;
a second substrate opposite to the first substrate;
an electrode structure, comprising a first electrode disposed on the first substrate and a second electrode disposed on the second substrate, wherein a vertical electric field is generated when a voltage is applied to the first electrode and the second electrode; and
a light-emitting combination laver, positioned between the first electrode and the second electrode, and the light-emitting combination layer comprising a light emitting material and a liquid crystal material, wherein the liquid crystal material comprises polymer-stabilized ferroelectric liquid crystals, comprising ferroelectric liquid crystals and a polymer network which stabilizes the ferroelectric liquid crystals.

* * * * *